US012690468B2

(12) United States Patent　　(10) Patent No.:　US 12,690,468 B2
Lim et al.　　　　　　　　　　　(45) Date of Patent:　　　Jul. 21, 2026

(54) SEMICONDUCTOR PACKAGE

(71) Applicant: Samsung Electronics Co., Ltd., Suwon-si (KR)

(72) Inventors: Jae Hyun Lim, Suwon-si (KR); Sung Woo Park, Suwon-si (KR); Hyun Jong Moon, Suwon-si (KR); Kwang Jin Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 404 days.

(21) Appl. No.: 18/344,981

(22) Filed: Jun. 30, 2023

(65) Prior Publication Data

US 2024/0087991 A1　　Mar. 14, 2024

(30) Foreign Application Priority Data

Sep. 14, 2022　(KR) ........................ 10-2022-0115531

(51) Int. Cl.
H10W 70/40　　　(2026.01)
H10W 72/00　　　(2026.01)
(Continued)

(52) U.S. Cl.
CPC ........ H10W 70/411 (2026.01); H10W 70/421 (2026.01); H10W 70/465 (2026.01); H10W 74/111 (2026.01); H10W 72/884 (2026.01); H10W 90/734 (2026.01); H10W 90/756 (2026.01)

(58) Field of Classification Search
CPC .......... H01L 23/49503; H01L 23/3107; H01L 23/4952; H01L 23/49541; H01L 24/32; H01L 24/48; H01L 24/73; H01L 2224/32225; H01L 2224/48247; H01L 2224/73265; H10W 70/411;
(Continued)

(56) References Cited

U.S. PATENT DOCUMENTS 6,208,020 B1　　3/2001　Minamio et al.
6,661,087 B2　12/2003　Wu
(Continued)

FOREIGN PATENT DOCUMENTS

JP　　　　2004-327903 A　　11/2004
JP　　　　2014-060263 A　　　4/2014
KR　10-2002-0061225 A　　　7/2002

OTHER PUBLICATIONS

Korean Office Action dated Jan. 27, 2026 in corresponding Korean Patentg Application No. 10-2022-0115531.

*Primary Examiner* — Zandra V Smith
(74) *Attorney, Agent, or Firm* — Harness, Dickey & Pierce, P.L.C.

(57) ABSTRACT

A semiconductor package including a die paddle, a first lead spaced apart from the die paddle and on one side of the die paddle, a second lead spaced apart from the die paddle and on another side of the die paddle, a spacer on the die paddle, a semiconductor die on the spacer, a first wire configured to connect an upper surface of the semiconductor die to the first lead, and a mold film configured to cover the die paddle, the first lead, the second lead, the spacer, the semiconductor die, and the first wire, wherein a first width of the spacer is greater than a second width of the die paddle so that the spacer overlaps the first lead may be provided.

19 Claims, 24 Drawing Sheets

(51) Int. Cl.
  *H10W 74/10* (2026.01)
  *H10W 90/00* (2026.01)

(58) Field of Classification Search
  CPC ............. H10W 70/421; H10W 70/465; H10W 74/111; H10W 72/884; H10W 90/734; H10W 90/756
  USPC ................................. 257/676, 23.03, 23.039
  See application file for complete search history.

(56) References Cited

U.S. PATENT DOCUMENTS

| | | | |
|---|---|---|---|
| 6,927,478 B2 * | 8/2005 | Paek | ................. H01L 23/49575 |
| | | | 257/676 |
| 7,112,871 B2 | 9/2006 | Shiu et al. | |
| 7,595,551 B2 | 9/2009 | Ramakrishna | |
| 8,405,230 B2 | 3/2013 | Lee et al. | |
| 8,969,139 B2 | 3/2015 | Han | |
| 9,508,631 B1 | 11/2016 | Bae et al. | |

\* cited by examiner

SEMICONDUCTOR PACKAGE

CROSS-REFERENCE TO RELATED APPLICATION

This application claims priority from Korean Patent Application No. 10-2022-0115531 filed on Sep. 14, 2022 in the Korean Intellectual Property Office, and all the benefits accruing therefrom under 35 U.S.C. 119, the contents of which in its entirety are herein incorporated by reference.

BACKGROUND

1. Technical Field

The present disclosure relates to semiconductor packages.

2. Description of the Related Art

Dual flat no-lead (DFN) and Quad flat no-lead (QFN) are lead frame package platforms with excellent heat dissipation capability based on a simple manufacturing method and are widely applied to single integrated circuit (IC) packaging for automotives, servers, and data center applications that have long product life cycle and require high reliability. In a lead frame package structure, conventionally, the size of a semiconductor die is smaller than that of a die paddle, but as the functions of the semiconductor die increases, the size of the semiconductor die becomes larger than the size of the die paddle. Accordingly, an overhang region in which the semiconductor die is not supported by the die paddle is generated, and when input/output pads are formed in the overhang region and wires are connected to the input/output pads, the bonding strength of the die attach film (DAF) is weakened and wire bonding Interface delamination and chip crack risk occur due to wire bonding bouncing. Thus, research is underway to improve the structure of a lead frame package, which is vulnerable in terms of reliability.

SUMMARY

Aspects of the present disclosure provide semiconductor packages having a stable structure and improved reliability.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, a semiconductor package may include a die paddle, a first lead spaced apart from the die paddle and on one side of the die paddle, a second lead spaced apart from the die paddle and on another side of the die paddle, a spacer on the die paddle, a semiconductor die on the spacer, a first wire configured to connect an upper surface of the semiconductor die to the first lead, and a mold film configured to cover the die paddle, the first lead, the second lead, the spacer, the semiconductor die, and the first wire, wherein a first width of the spacer is greater than a second width of the die paddle so that the spacer overlaps the first lead.

According to another aspect of the present disclosure, a semiconductor package may include a die paddle, a first lead spaced apart from the die paddle and on one side of the die paddle, a second lead spaced apart from the die paddle and on another side of the die paddle, a spacer on the die paddle, a semiconductor die disposed on the spacer, a first wire configured to connect an upper surface of the spacer to the first lead, a second wire configured to connect an upper surface of the semiconductor die to the first lead, and a mold film configured to cover the die paddle, the first lead, the spacer, the semiconductor die, the first wire, and the second wire, wherein the die paddle is apart from the first lead by a first space, the first wire is in contact with a first region of the spacer that overlaps the first lead, and the second wire is in contact with a second region of the semiconductor die that overlaps the first space.

According to the other aspect of the present disclosure, a semiconductor package may include a die paddle having a first side surface and a second side surface, a first lead spaced apart from the first side surface, a second lead spaced apart from the second side surface that faces the first side surface, a first semiconductor die attached to an upper surface of the die paddle, a second semiconductor die attached to an upper surface of the first semiconductor die, and a mold film configured to cover the die paddle, the first lead, the second lead, the first semiconductor die, and the second semiconductor die, wherein a first width of the first semiconductor die is greater than a second width of the die paddle so that the first semiconductor die overlaps the first lead, the first semiconductor die is connected to the first lead through a first wire, and the second semiconductor die is connected to the first lead through a second wire.

It should be noted that the effects of the present disclosure are not limited to those described above, and other effects of the present disclosure will be apparent from the following description.

BRIEF DESCRIPTION OF THE DRAWINGS

The above and other aspects and features of the present disclosure will become more apparent by describing in detail some example embodiments thereof with reference to the attached drawings, in which:

FIG. 12 is a cross-sectional view taken along line IV-IV of FIG. 11.

FIG. 13 is a perspective view illustrating a semiconductor package according to a fifth example embodiment of the present disclosure.

FIG. 14 is a plan view of the semiconductor package of FIG. 13 when viewed downward in the Z-axis direction.

FIG. 15 is a cross-sectional view taken along line V-V of FIG. 14.

FIG. 16 is a perspective view illustrating a semiconductor package according to a sixth example embodiment of the present disclosure.

FIG. 21 is a cross-sectional view taken along line VII-VII of FIG. 20.

DETAILED DESCRIPTION

Hereinafter, some example embodiments of the present disclosure will be described with reference to the attached drawings.

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 1:
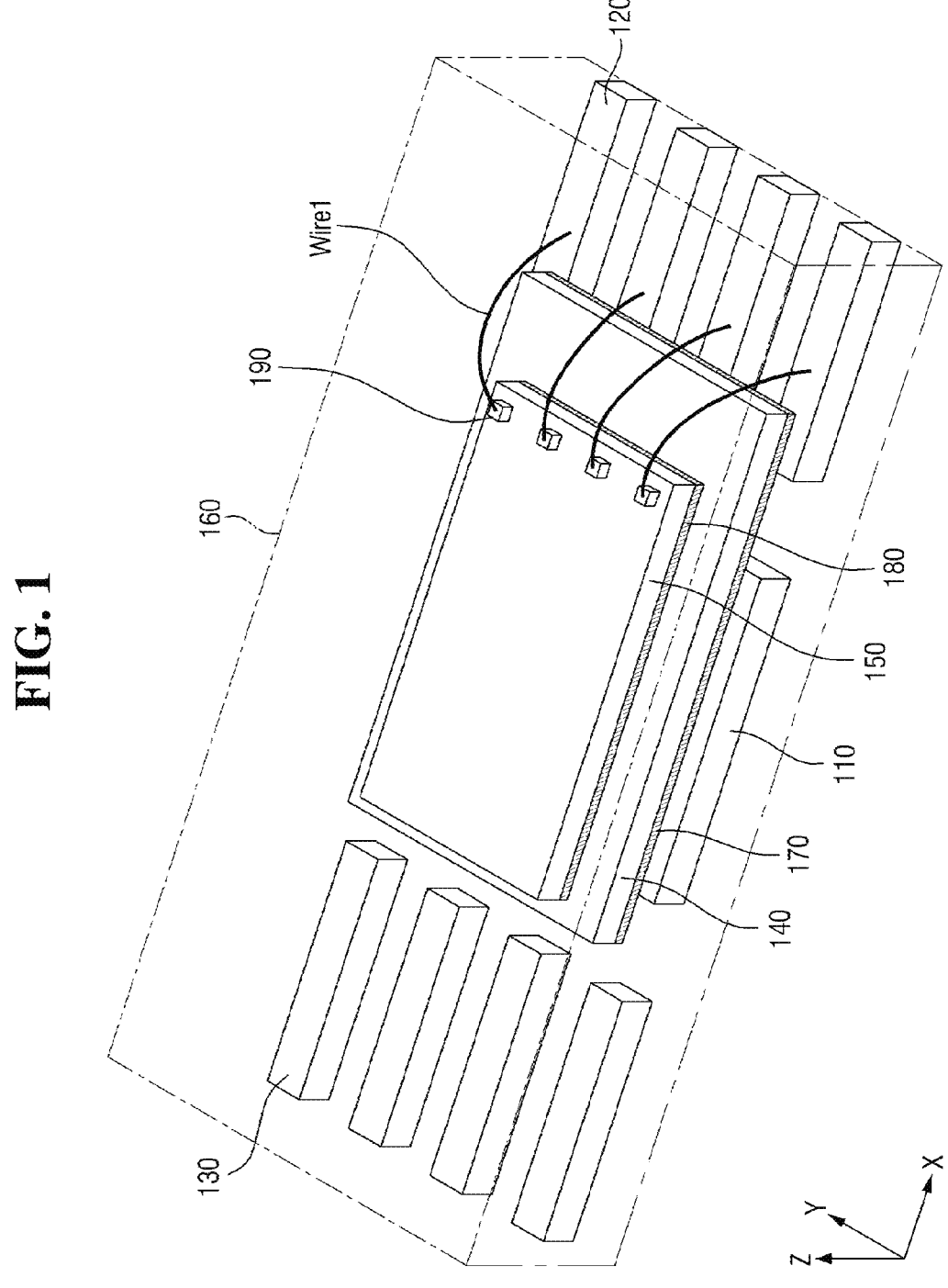
FIG. 1 is a perspective view illustrating a semiconductor package according to a first example embodiment of the present disclosure.

FIG. 1 is a perspective view illustrating a semiconductor package according to a first example embodiment of the present disclosure.

Referring to FIG. 1, a semiconductor package according to a first example embodiment of the present disclosure includes a die paddle 110, first leads 120, second leads 130, a spacer 140, a semiconductor die 150, first wires Wire1, and a mold film 160. The semiconductor package according to the first example embodiment of the present disclosure is of a dual flat no-lead (DFN) structure, in which the die paddle 110, the first leads 120, and the second leads 130 form a lead frame package platform.

The die paddle 110 may support the spacer 140 and the semiconductor die 150, which are disposed on an upper surface of the die paddle 110, and may include metal. The die paddle 110 may have a quadrangular column shape with four side surfaces and a rectangular or square bottom surface. However, example embodiments are not limited to this case, and the die paddle 110 may have a polygonal column shape with three or more side surfaces. In the following description, the die paddle 110 having a quadrangular column shape will be discussed.

The first leads 120 and the second leads 130 may be disposed around the die paddle 110. The first leads 120 and the second leads 130 may be connected to the semiconductor die 150 and a printed circuit board (PCB) to transmit a signal of the semiconductor die 150 to the PCB or to transmit a signal of the PCB to the semiconductor die 150. In the semiconductor package according to the first example embodiment of the present disclosure, the first leads 120 and the second leads 130 are disposed on two facing side surface portions among the four side surfaces of the die paddle 110 respectively. Although FIG. 1 illustrates that four leads are disposed on each of the two facing side surface portions, the number of leads disposed around the die paddle 110 may vary depending on example embodiments.

The first leads 120 may be spaced apart from the die paddle 110 and disposed on one side surface of the die paddle 110. The first leads 120 may be electrically connected to the semiconductor die 150 via the first wires Wire1. The second leads 130 may be spaced apart from the die paddle 110 and disposed on the opposite side surface of the die paddle 110. The first leads 120 and the second leads 130 may be disposed to face each other.

The spacer 140 may be disposed on the upper surface of the die paddle 110. The spacer 140 may be dummy silicon. That is, the spacer 140 may not be a semiconductor die serving an actual function, and may only serve to support the semiconductor die 150 disposed on an upper surface of the spacer 140.

The semiconductor die 150 may be disposed on the upper surface of the spacer 140. First input/output pads 190 connected to the first wires Wire1 may be formed on the upper surface of the semiconductor die 150. The semiconductor die 150 may be connected to the first leads 120 through the wires Wire1 to transmit and receive a signal to and from the PCB. Although FIG. 1 illustrates one semiconductor die 150, this is merely for convenience of description. Semiconductor packages according to example embodiments of the present disclosure may include two or more semiconductor dies.

A first adhesive layer 170 and a second adhesive layer 180 may be formed on bottom surfaces of the spacer 140 and the semiconductor die 150, respectively. The first adhesive layer 170 and the second adhesive layer 180 may be die attach films including epoxy. By the first adhesive layer 170, the spacer 140 and the die paddle 110 may be attached to each other and the spacer 140 and the first leads 120 may be attached to each other. Further, the spacer 140 and the semiconductor die 150 may be attached to each other by the second adhesive layer 180.

The mold film 160 may be filled in the space between structures constituting the semiconductor package according to the first example embodiment of the present disclosure, while covering the die paddle 110, the first leads 120, the second leads 130, the spacer 140, the semiconductor die 150, and the first wires Wire1. The mold film 160 may include, for example, an insulating polymer material, such as an epoxy molding compound.

Figure 2:
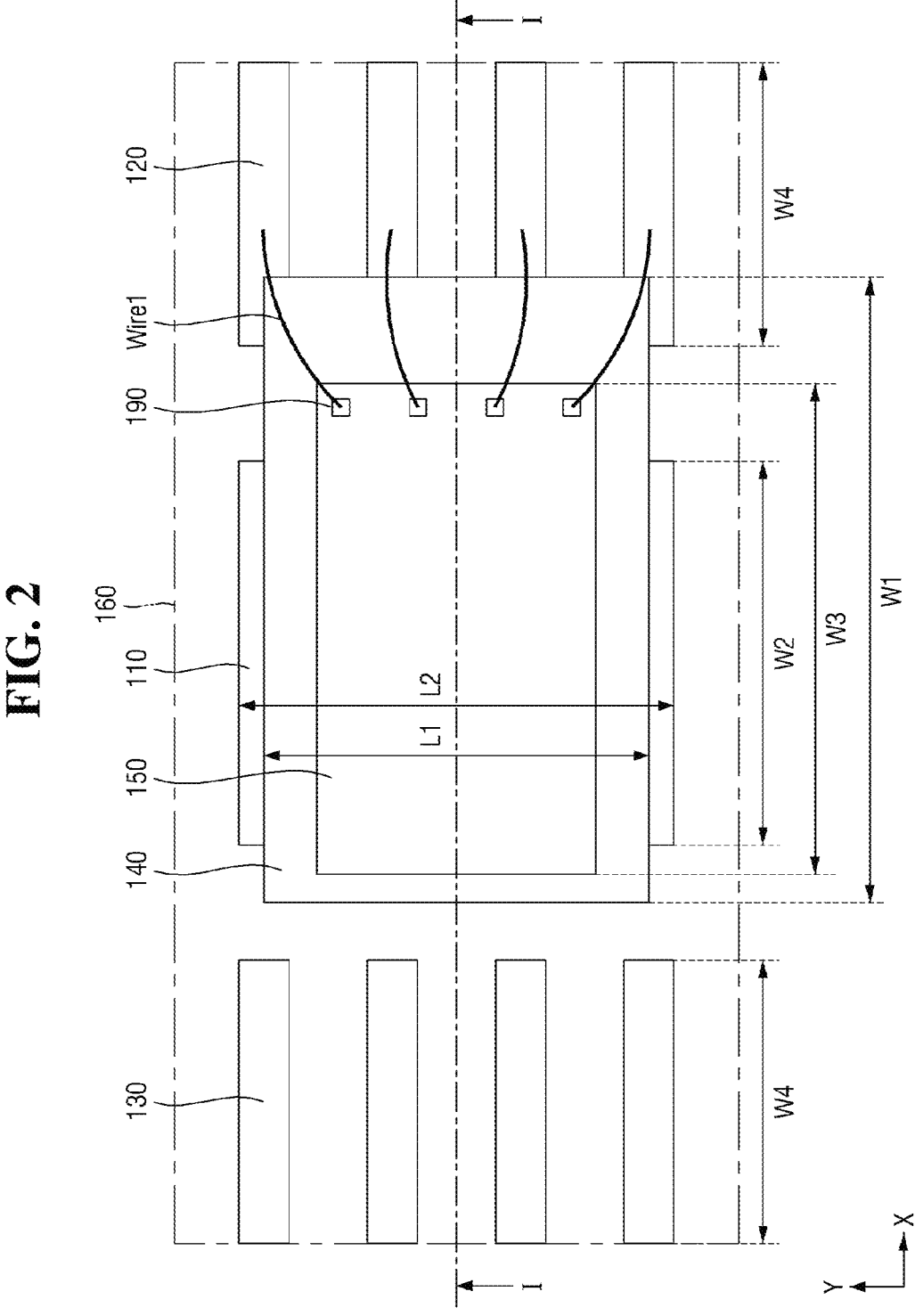
FIG. 2 is a plan view of the semiconductor package of FIG. 1 when viewed downward in a Z-axis direction.
Figure 3:
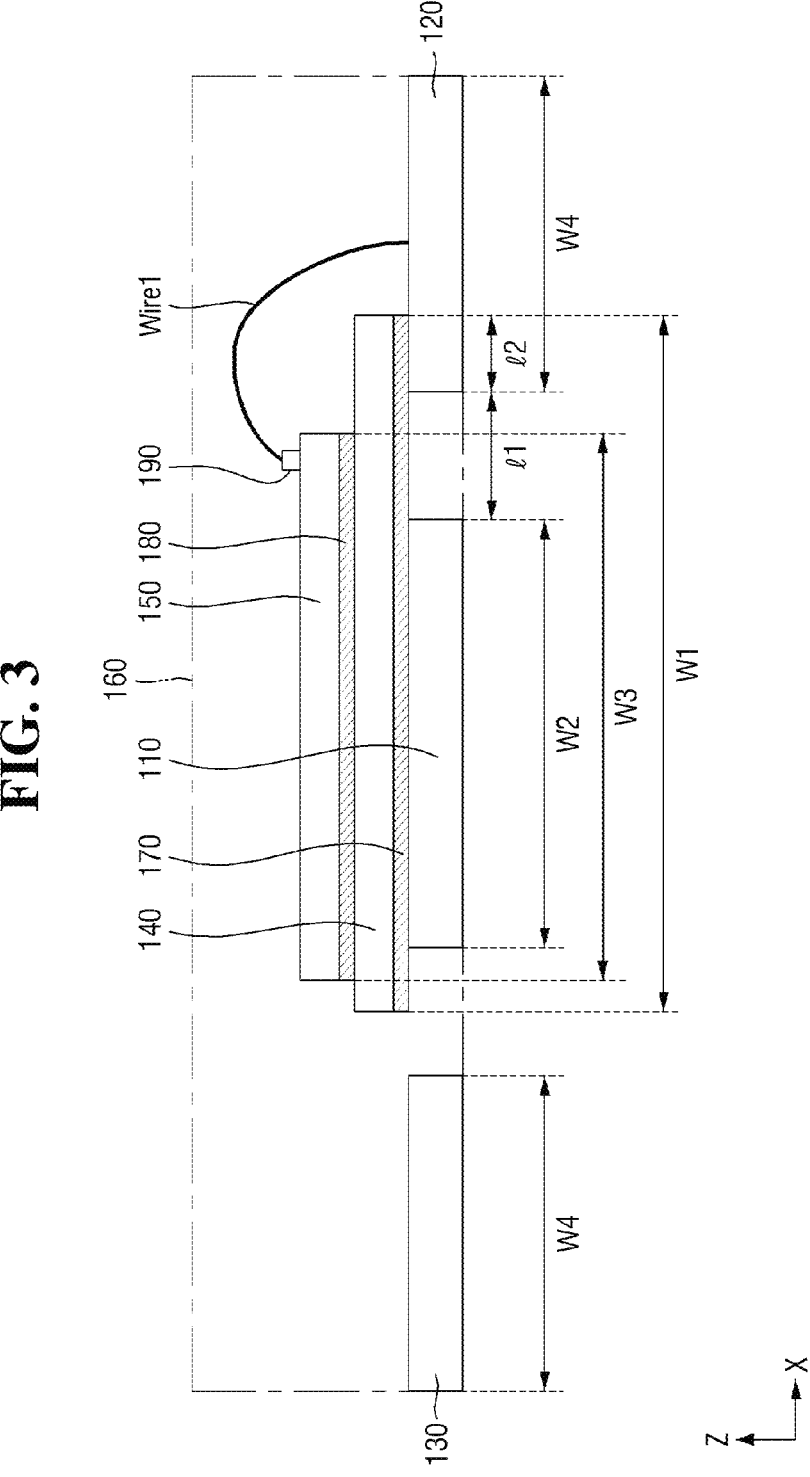
FIG. 3 is a cross-sectional view taken along line I-I of FIG. 2.

FIG. 2 is a plan view of the semiconductor package of FIG. 1 when viewed downward in a Z-axis direction. FIG. 3 is a cross-sectional view taken along line I-I of FIG. 2. Hereinafter, the semiconductor package according to the first example embodiment of the present disclosure will be described in further detail with reference to FIGS. 2 and 3.

Referring to FIG. 2, a width W3 of the semiconductor die 150 in a first direction (X-axis direction) may be greater than a width W2 of the die paddle 110 in the first direction. As such, as functions of the semiconductor die 150 increase, the size of the semiconductor die 150 becomes larger than the size of the die paddle 110, and accordingly, the semiconductor die 150 may not be completely supported by the die paddle 110. That is, the semiconductor die 150 may have overhang regions that are not supported by the die paddle 110.

Accordingly, when the first input/output pad 190 is formed in the overhang region and the first wire Wire1 is bonded to the first input/output pad 190, the bonding force of the adhesive layer Adhesive1 170 may be weakened. In addition, interfacial delamination between the die paddle 110 and the spacer 140 may occur due to wire bonding bouncing. Accordingly, the structure of the semiconductor package may become unstable.

In the semiconductor package according to the first example embodiment of the present disclosure, the spacer 140 may be disposed between the semiconductor die 150 and the die paddle 110 in order to provide structural stability when the first wires Wire1 are connected to the upper surface of the semiconductor die 150. As shown in FIG. 2, a width W1 of the spacer 140 measured in the first direction is greater than a width W2 of the die paddle 110 measured in the first direction so that the spacer 140 may overlap the first leads 120. At this time, a length L1 of the spacer 140 in a second direction (Y-axis direction) may be shorter than a length L2 of the die paddle 110 in the second direction.

As shown in FIG. 3, when the wire Wire1 is bonded to the first input/output pad 190 formed on the upper surface of the semiconductor die 150 in a state where the spacer 140 overlaps the first leads 120 and supports the semiconductor die 150, a point at which the wire Wire1 is connected to the upper surface of the semiconductor die 150 is supported by the spacer 140, and thus structural stability may be achieved.

In this case, a ratio of a length l2 of a portion of the spacer 140 overlapping the first leads 120 to a length l1 between the die paddle 110 and the first leads 120 may be between about 1/5 and about 1/2. If the ratio of l2 to l1 is less than about 1/5, the area where the spacer 140 overlaps the first leads 120 becomes too small, so that the spacer 140 may not be sufficiently supported by the first leads 120. In addition, if the ratio of l2 to l1 is greater than about 1/2, the area where the spacer 140 overlaps the first leads 120 becomes too large, so that it may be difficult to stably connect the wire Wire1 to the first leads 120.

A width W4 of the first leads 120 measured in the first direction and a width of the second leads 130 measured in the first direction may be the same. Also, the width W4 measured in the first direction of the first leads 120 and the second leads 130 constituting the lead frame package platform may be standardized to about 3 mm. In this case, the length l2 of the portion of the spacer 140 overlapping the first leads 120 may be about 10 μm to about 3 mm. If the length l2 of the portion of the spacer 140 overlapping the first leads 120 is less than about 10 m, the overlapping area of the spacer 140 and the first leads 120 becomes too small, so that the spacer 140 may not be stably supported by the first leads 120.

As such, when the first wire Wire1 is bonded in a semiconductor package of a DFN structure in which the size of the semiconductor die 150 is larger than the size of the die paddle 110, the spacer 140 may be supported by the die paddle 110 and the first leads 120. In addition, when the wire Wire1 is connected to the first input/output pad 190 formed in the overhang region of the upper surface of the semiconductor die 150, the structure of the semiconductor package may become stable.

Figure 4:
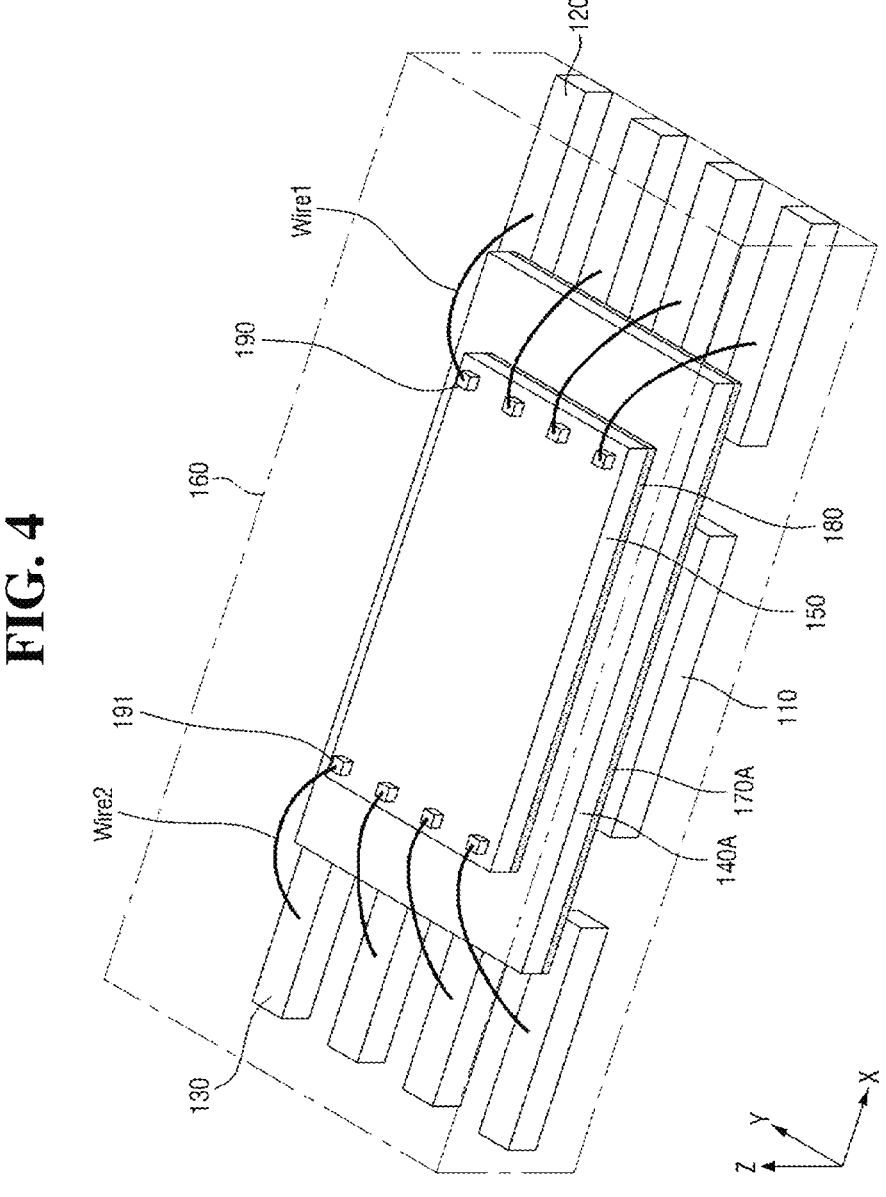
FIG. 4 is a perspective view illustrating a semiconductor package according to a second example embodiment of the present disclosure.
Figure 5:
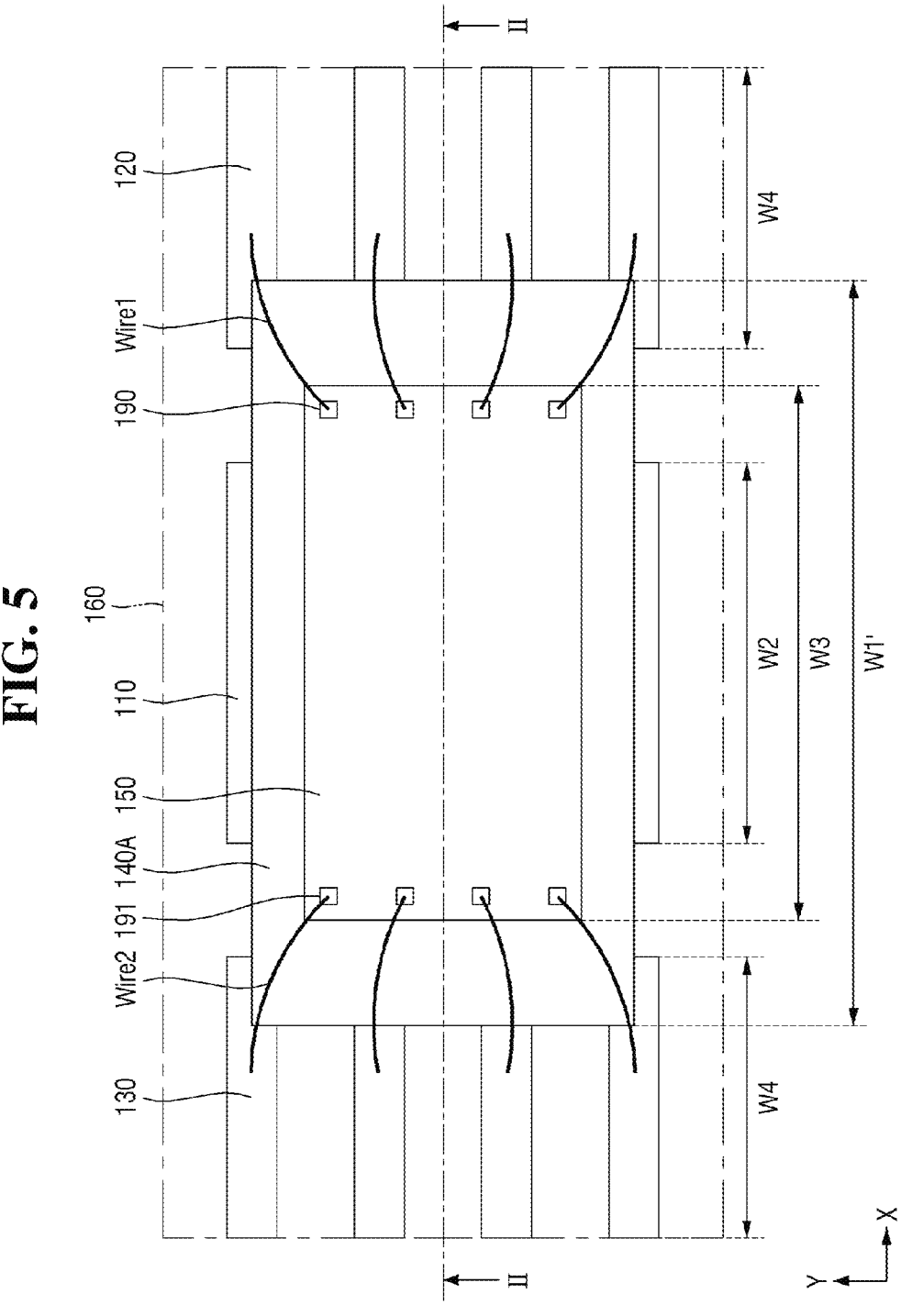
FIG. 5 is a plan view of the semiconductor package of FIG. 4 when viewed downward in the Z-axis direction.
Figure 6:
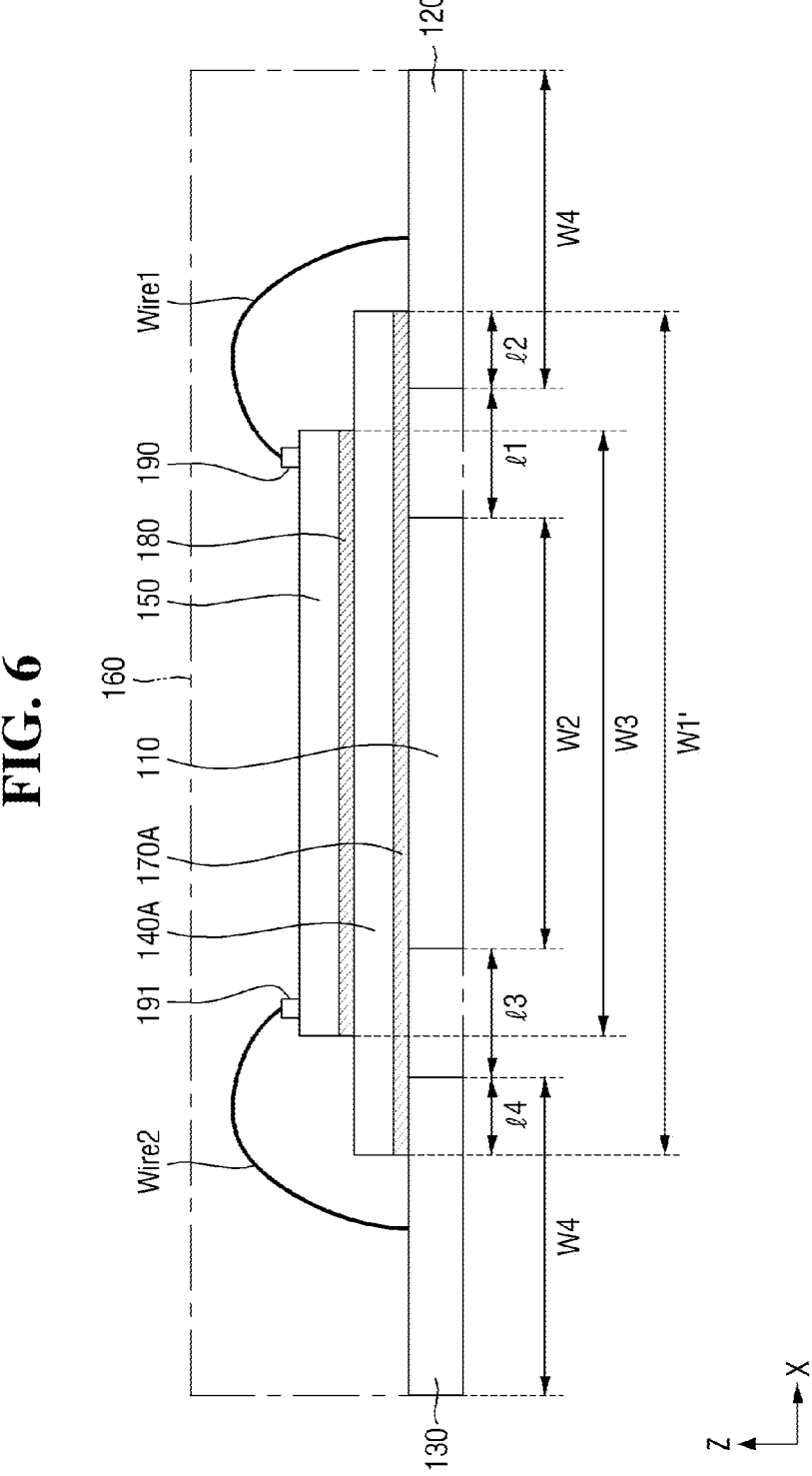
FIG. 6 is a cross-sectional view taken along line II-II of FIG. 5.

FIG. 4 is a perspective view illustrating a semiconductor package according to a second example embodiment of the present disclosure. FIG. 5 is a plan view of the semiconductor package of FIG. 4 when viewed downward in the Z-axis direction. FIG. 6 is a cross-sectional view taken along line II-II of FIG. 5. Hereinafter, redundant descriptions will be omitted and differences from the above example embodiment will be mainly described.

First, referring to FIG. 4, a semiconductor package according to a second example embodiment of the present disclosure includes a die paddle 110, first leads 120, second leads 130, a spacer 140A, a semiconductor die 150, first wires Wire1, second wires Wire2, and a mold film 160. The spacer 140A may be disposed on an upper surface of the die paddle 110. The die paddle 110 may support the spacer 140A disposed on an upper surface of the die paddle 110. In this case, the spacer 140A and the die paddle 110 may be attached to each other by a first adhesive layer 170A formed on a bottom surface of the spacer 140A.

The second leads 130 may be electrically connected to the semiconductor die 150 via the second wires Wire2. That is, the second wires Wire2 may be connected to second input/output pads 191 formed on an upper surface of the semiconductor die 150, and the second wires Wire2 may be bonded to the second leads 130. The spacer 140A may be dummy silicon. That is, the spacer 140A may not be a semiconductor die serving an actual function, and may only serve to support the semiconductor die 150 disposed on an upper surface of the spacer 140A.

The semiconductor die 150 may be disposed on the upper surface of the spacer 140A. The semiconductor die 150 may be connected to the second leads 130 through the second wires Wire2 to transmit and receive a signal to and from the PCB. Although FIG. 2 illustrates one semiconductor die 150, this is merely for convenience of description. Semiconductor packages according to some example embodiments of the present disclosure may include two or more semiconductor dies. The mold film 160 may be filled in the space between structures constituting the semiconductor package according to the second example embodiment of the present disclosure, while covering the die paddle 110, the first leads 120, the second leads 130, the spacer 140A, semiconductor die 150, the first wires Wire1 and the second wires Wire2.

Then, referring to FIGS. 5 and 6, a width W3 measured in the first direction of the semiconductor die 150 supported by the spacer 140A may be less than a width W1' measured in the first direction of the spacer 140A. In addition, the width W1' measured in the first direction of the spacer 140a is greater than a width W2 measured in the first direction of the die paddle 110 so that the spacer 140A may overlap the first leads 120 and the second leads 130.

As shown in FIG. 6, the second wire Wire2 is bonded to the second input/output pad 191 formed on the upper surface of the semiconductor die 150 in a state where the spacer 140A overlaps the second leads 130 and supports the semiconductor die 150. Thus, a point at which the second wire Wire2 is connected to the upper surface of the semiconductor die 150 is supported by the spacer 140A, and thus structural stability may be achieved. That is, in FIG. 6, unlike FIG. 3, the spacer 140A is supported by the first leads 130, and accordingly, the second input/output pad 191 may be formed on the upper surface of the semiconductor die 150 and the second wire Wire2 may be bonded to the second input/output pad 191.

In this case, a ratio of a length l4 of a portion of the spacer 140A overlapping the second leads 130 to a length l3 between the die paddle 110 and the second leads 130 may be between about 1/5 and about 1/2. If the ratio of l2 to l1 is less than about 1/5, an area where the spacer 140A overlaps the second leads 130 becomes too small so that the spacer 140A may not be sufficiently supported by the second leads 130. In addition, if the ratio of l2 to l1 is greater than about 1/2, the area where the spacer 140A overlaps the second leads 130 becomes too large. Thus, it may be difficult to stably connect the wire Wire2 to the second leads 130.

Also, the length l4 of a portion of the spacer 140A overlapping the second leads 130 may be about 10 μm to about 3 mm. If the length l2 of the portion of the spacer 140A overlapping the second leads 130 is less than about 10 μm, the area of the spacer 140A overlapping the second leads 130 becomes too small, and thus the spacer 140A may not be stably supported by the second lead 130.

As such, when the first wire Wire1 and the second wire Wire2 are bonded in a semiconductor package of a DFN structure in which the size of the semiconductor die 150 is larger than the size of the die paddle 110, the spacer 140A may be supported by the die paddle 110, the first leads 120, and the second leads 130. In addition, when the second wire Wire2 is connected to the second input/output pad Pad2 191 formed in an overhang region of the upper surface of the semiconductor die 150, the structure of the semiconductor package may become stable.

Figure 7:
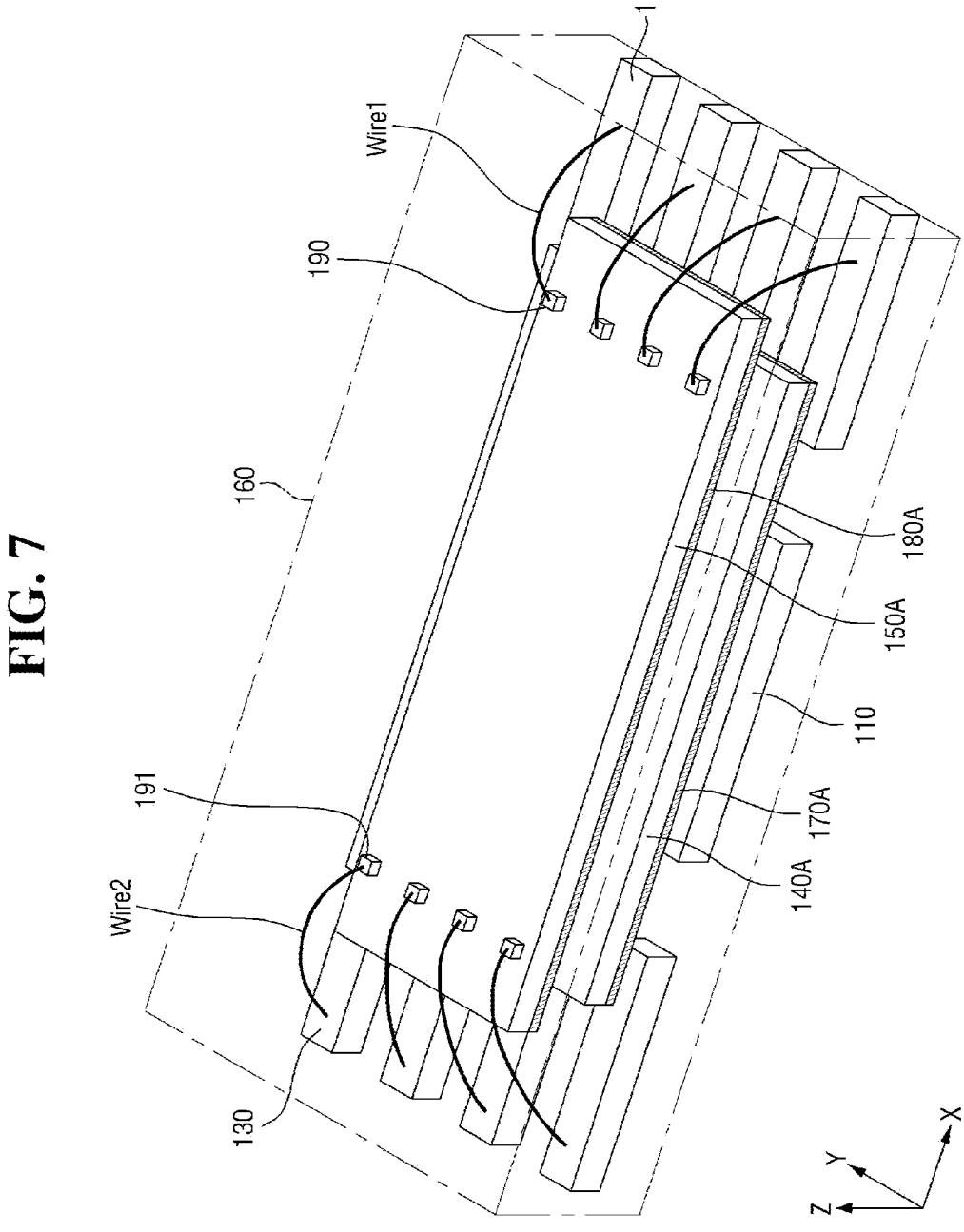
FIG. 7 is a perspective view illustrating a semiconductor package according to a third example embodiment of the present disclosure.
Figure 8:
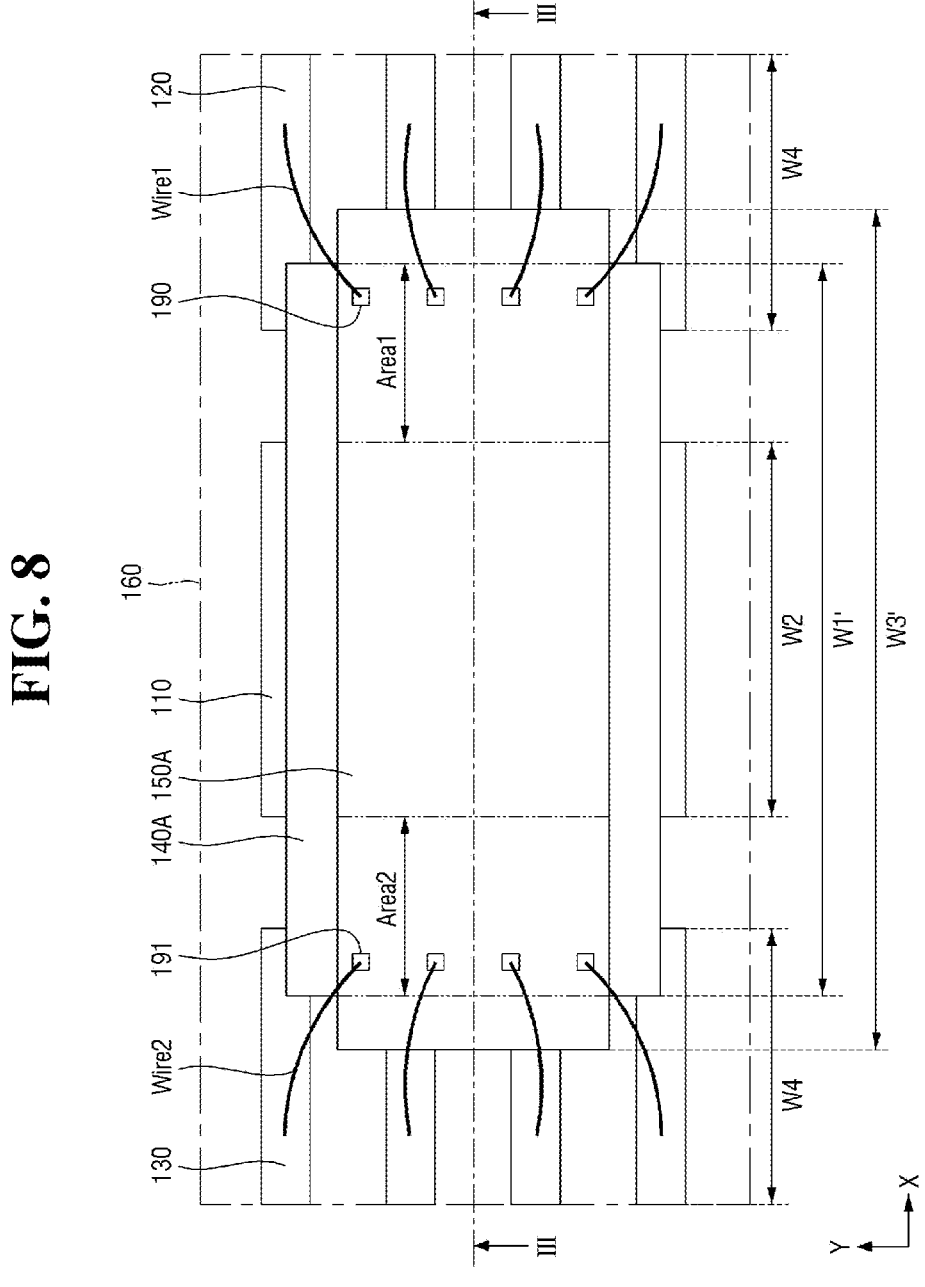
FIG. 8 is a plan view of the semiconductor package of FIG. 7 when viewed downward in the Z-axis direction.
Figure 9:
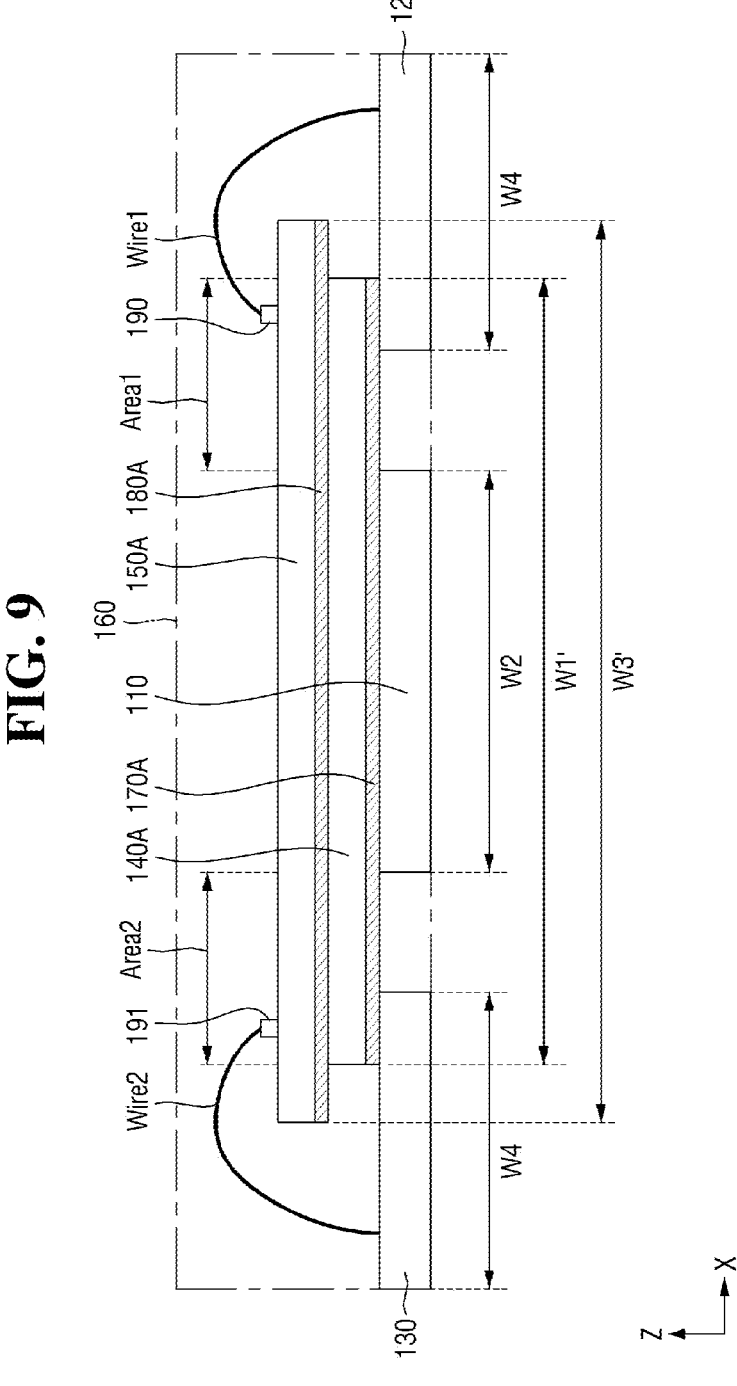
FIG. 9 is a cross-sectional view taken along line III-III of FIG. 8.

FIG. 7 is a perspective view illustrating a semiconductor package according to a third example embodiment of the present disclosure. FIG. 8 is a plan view of the semiconductor package of FIG. 7 when viewed downward in the Z-axis direction. FIG. 9 is a cross-sectional view taken along line III-III of FIG. 8. Hereinafter, redundant descriptions will be omitted and differences from the above example embodiments will be mainly described.

First, referring to FIG. 7, a semiconductor package according to a third example embodiment of the present disclosure includes a die paddle 110, first leads 120, second leads 130, a spacer 140A, a semiconductor die 150A, first wires Wire1, second wires Wire2, and a mold film 160. The semiconductor die 150A may be disposed on an upper surface of the spacer 140A. In this case, the spacer 140A and the semiconductor die 150A may be attached to each other by a second adhesive layer 180A formed on a bottom surface of the semiconductor die 150A.

Then, referring to FIGS. 8 and 9, in the semiconductor package according to the third example embodiment of the present disclosure, a width W3' measured in the first direction of the semiconductor die 150A supported by the spacer 140A may be greater than a width W1' measured in the first direction of the spacer 140A, unlike the semiconductor package according to the second example embodiment of the present disclosure. In this case, first input/output pads 190 and second input/output pads 191 formed on the upper surface of the semiconductor die 150A may be formed in area 1 and area 2, which are overhang regions of the semiconductor die 150A and are supported by the spacer 140A, respectively. Accordingly, interfacial delamination and chip crack risk due to wire bonding bouncing may be mitigated of prevented and structural stability of the semiconductor package may be achieved when the first wires Wire1 are connected to the first input/output pads Pal 190 and the second wires Wire2 are connected to the second input/output pads 191.

Figure 10:
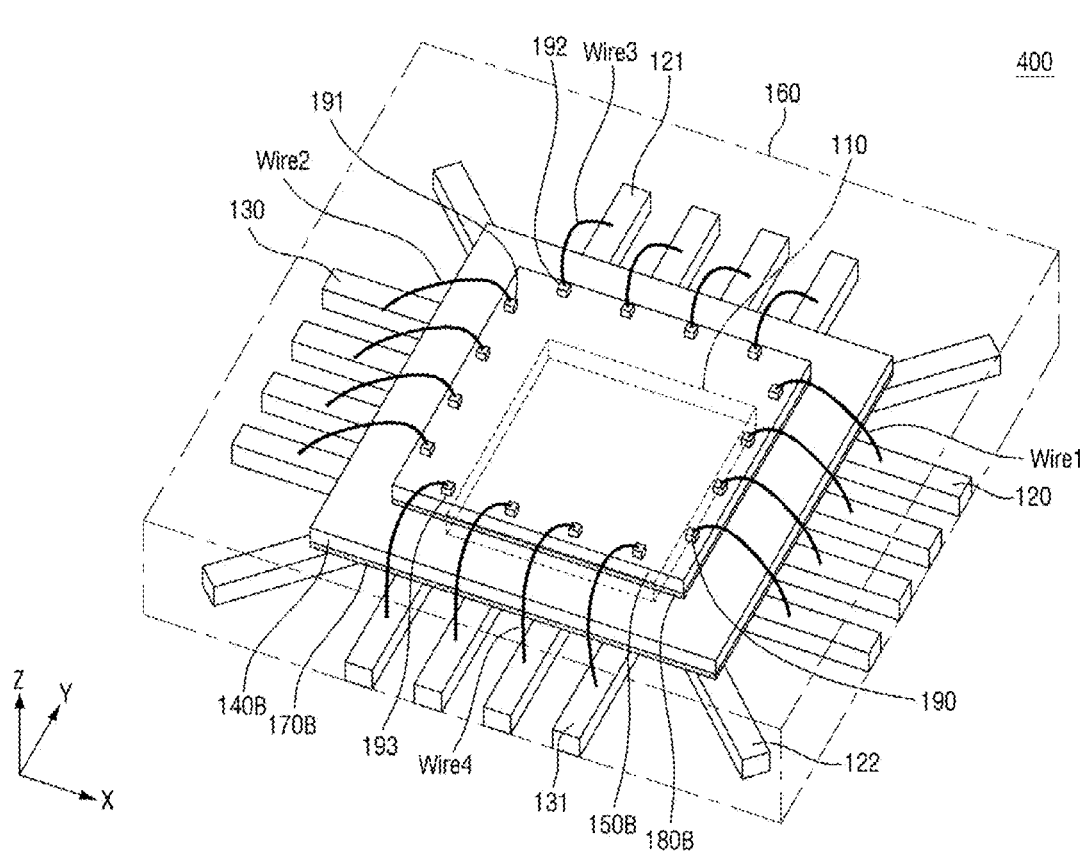
FIG. 10 is a perspective view illustrating a semiconductor package according to a fourth example embodiment of the present disclosure.

FIG. 10 is a perspective view illustrating a semiconductor package according to a fourth example embodiment of the present disclosure. Hereinafter, redundant descriptions will be omitted and differences from the above example embodiments will be mainly described.

Referring to FIG. 10, a semiconductor package according to a fourth example embodiment of the present disclosure includes a die paddle 110, first leads 120, second leads 130, third leads 121, fourth leads 131, a spacer 140B, a semiconductor die 150B, wires Wire1 to Wire4, and a mold film 160. The semiconductor package according to the fourth example embodiment of the present disclosure is of a quad flat no-lead (QFN) structure in which the die paddle 110, the first leads 120, the second leads 130, the third leads 121, and the fourth leads 131 form a lead frame package platform.

The die paddle 110 may support the spacer 140B and the semiconductor die 150B, which are disposed on an upper surface of the die paddle 110. A plurality of leads may be disposed around the die paddle 110. For example, as shown in FIG. 10, the first leads 120 and the second leads 130 may be disposed on two side surfaces facing each other among four side surfaces of the die paddle 110 and the third leads 121 and the fourth leads 131 may be disposed on the other two side surfaces facing each other. Remaining portions of tie bars 122 may be disposed on corners of the die paddle 110. Although FIG. 10 illustrates that four leads are disposed on each of four side surface portions, the number of leads disposed around the die paddle 110 may vary depending on example embodiments.

The third leads 121 may be spaced apart from the die paddle 110 and disposed on one side surface of the die paddle 110. The third leads 121 may be electrically connected to the semiconductor die 150B via the third wires Wire3. The fourth leads 131 may be spaced apart from the die paddle 110 and disposed on the opposite side surface of the die paddle 110. The fourth leads 131 may be electrically connected to the semiconductor die 150B via the fourth wires Wire4. The third leads 121 and the fourth leads 131 may be disposed to face each other.

Figure 11:
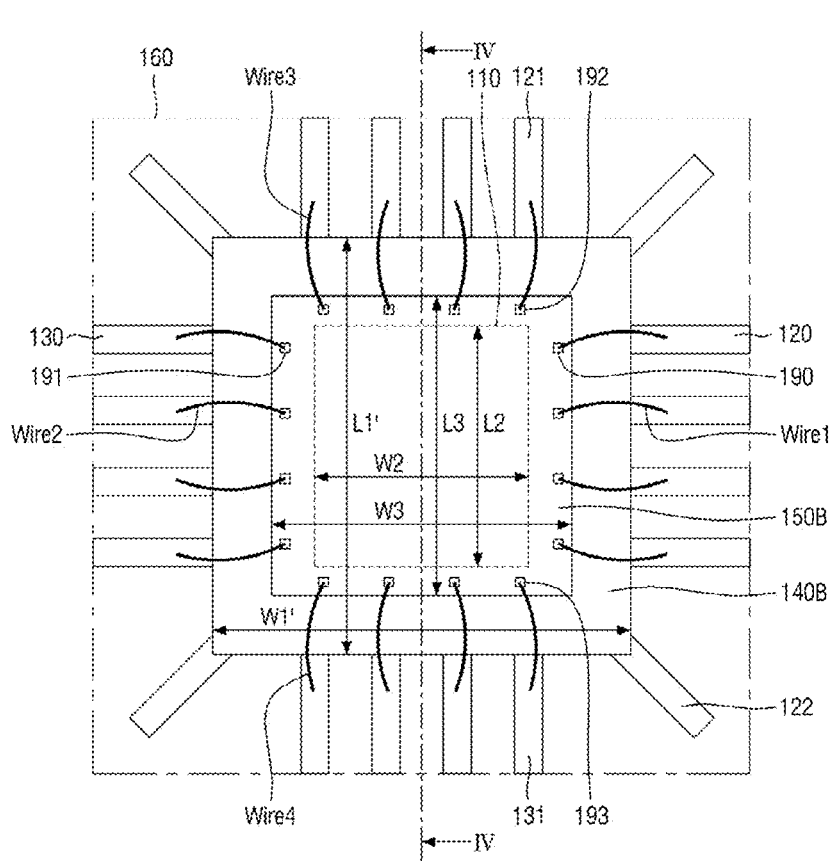
FIG. 11 is a plan view of the semiconductor package of FIG. 10 when viewed downward in the Z-axis direction.
Figure 12:
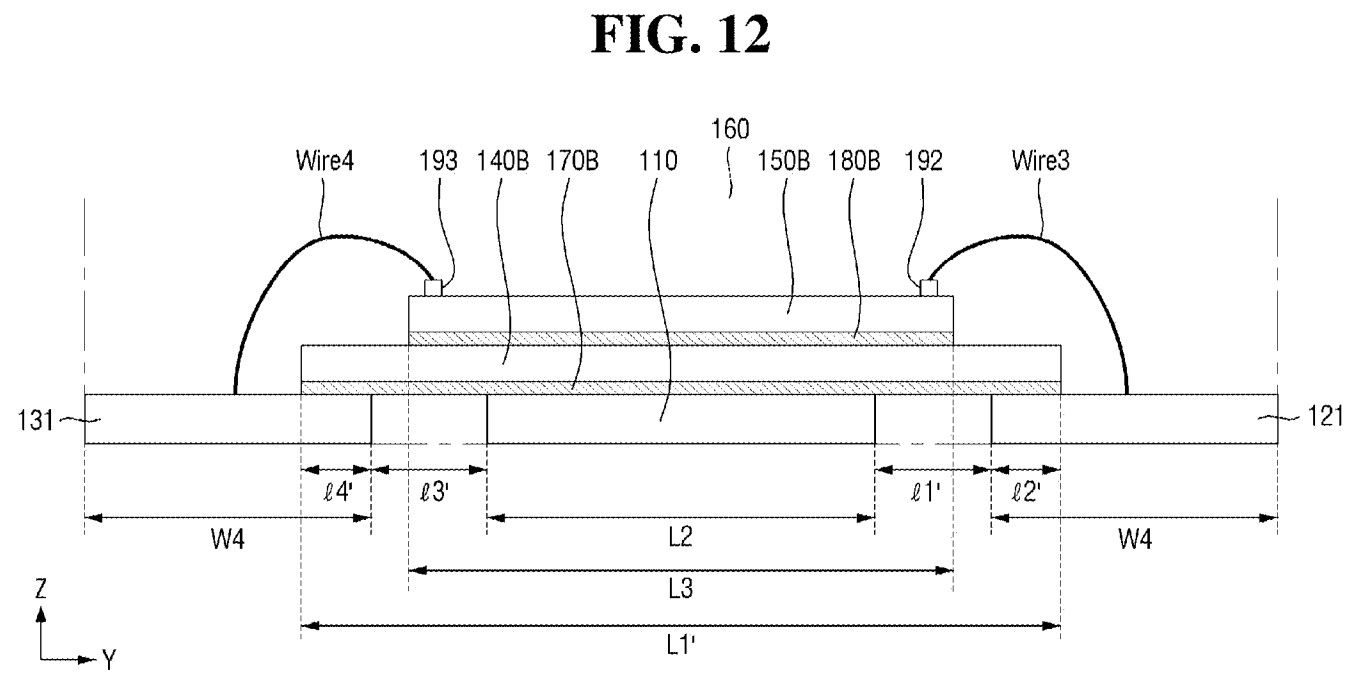

FIG. 11 is a plan view of the semiconductor package of FIG. 10 when viewed downward in the Z-axis direction. FIG. 12 is a cross-sectional view taken along line IV-IV of FIG. 11.

Referring to FIGS. 11 and 12, unlike the first to third example embodiment of the present disclosure, a length L1' of the spacer 140B in a second direction (Y-axis direction) may be longer than a length L2 of the die paddle 110 in the second direction. Accordingly, the spacer 140B may overlap the third leads 121 and the fourth leads 131. As such, overhang regions of the semiconductor die 150B that are not supported by the die paddle 110 may be supported by the spacer 140B. Edge regions of the spacer 140B that is not supported by the die paddle 110 may be supported by the third leads 121 and the fourth leads 131. Therefore, third input/output pads 192 and fourth input/output pads 193 are additionally disposed on an upper surface of the semiconductor die 150B so that the semiconductor die 150B may be electrically connected to the third leads 121 and the fourth leads 131 through the third wires Wire3 and the fourth wires Wire4, respectively.

A ratio of a length l2' of a portion of the spacer 140B overlapping the third leads 121 to a length l1' between the die paddle 110 and the third leads 121 and a ratio of a length l4' of a portion of the spacer 140B overlapping the fourth leads 131 to a length l3' between the die paddle 110 and the fourth leads 131 may be the same as the ratios for the first leads 120 and the second leads 130. In addition, the length l2' of the portion of the spacer 140B overlapping the third leads 121 and the length l4' of the portion of the spacer 140B overlapping the fourth leads Led4 131 may be the same as lengths associated with the first leads 120 and the second leads 130.

As such, when the first to fourth wires Wire1 to Wire4 are bonded in a semiconductor package of a QFN structure in which the size of the semiconductor die 150B is larger than the size of the die paddle 110, the spacer 140B may be supported by the die paddle 110 and the first and second leads 120, 130 in the first direction, and the spacer 140B may be supported by the die paddle 110 and the third and fourth leads 121, 131 in the second direction. As such, when the first to fourth wires Wire1 to Wire4 are connected to the overhang regions of the upper surface of the semiconductor die 150B, respectively, in a state where the spacer 140B are supported by the die paddle 110 and the first to fourth leads 120, 130, 121, 131, the structure of the semiconductor package may become stable.

Figure 13:
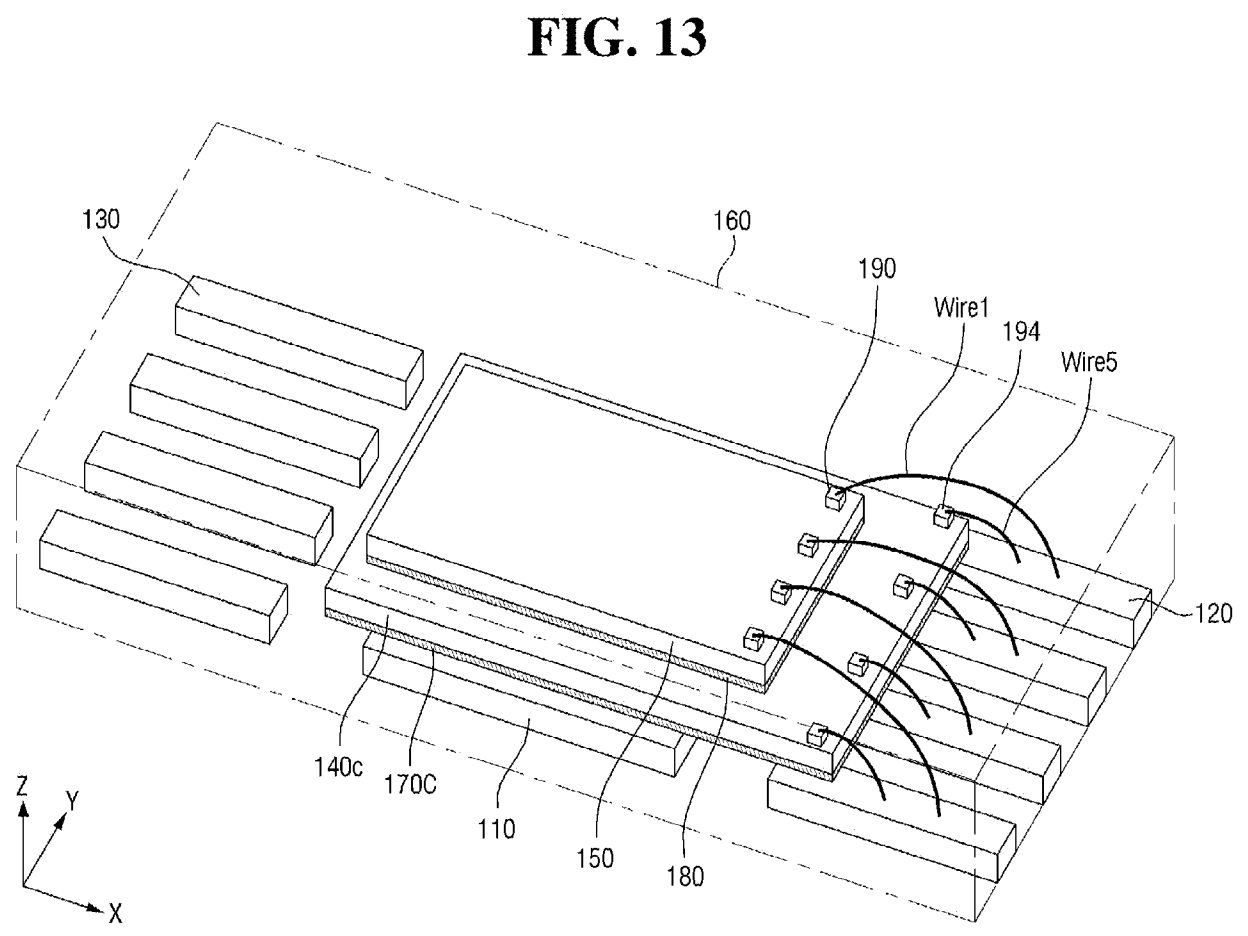

FIG. 13 is a perspective view illustrating a semiconductor package according to a fifth example embodiment of the present disclosure. Hereinafter, redundant descriptions will be omitted and differences from the above example embodiments will be mainly described.

Referring to FIG. 13, a semiconductor package according to a fifth example embodiment of the present disclosure includes a die paddle 110, first leads 120, second leads 130, a spacer 140C, a semiconductor die 150, first wires Wire1 and fifth Wire5, and a mold film 160. In this case, unlike the above example embodiments, the spacer 140C may be implemented as a semiconductor die serving an actual function, rather than dummy silicon. Thus, the spacer 140C may be referred to as another semiconductor die. That is, fifth input/output pads 194 may be formed on an upper surface of the spacer 140C and the fifth wires Wire5 may be connected to the fifth input/output pads 194. The spacer 140C may be connected to the first leads 120 through the fifth wires Wire5 to transmit and receive a signal to and from the PCB. As such, the spacer 140C serving to support the semiconductor die 150 may be implemented as a semiconductor die serving an actual function, rather than dummy silicon, so that the capacity of the semiconductor die mounted in the semiconductor package may be increased.

Figure 14:
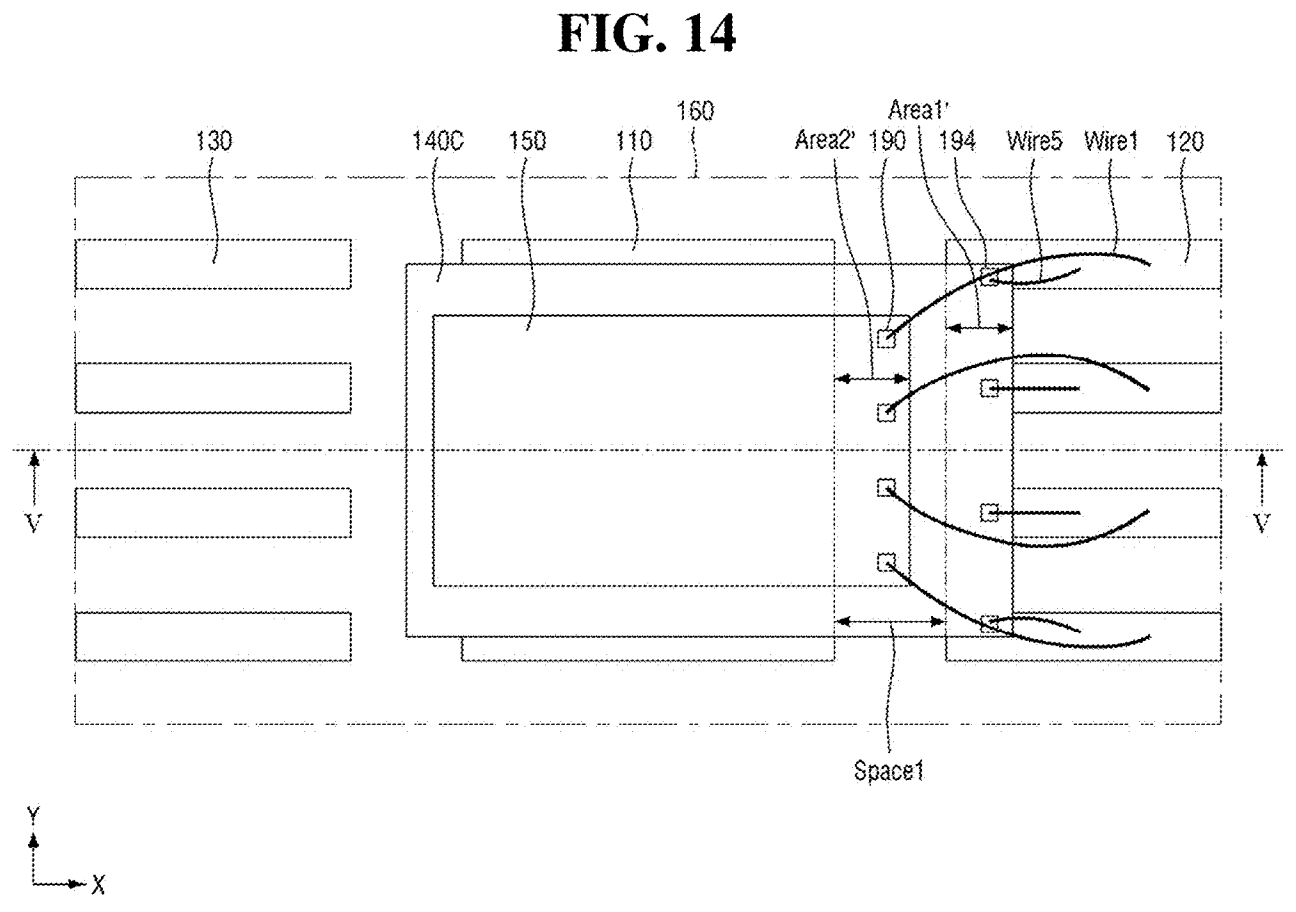
Figure 15:
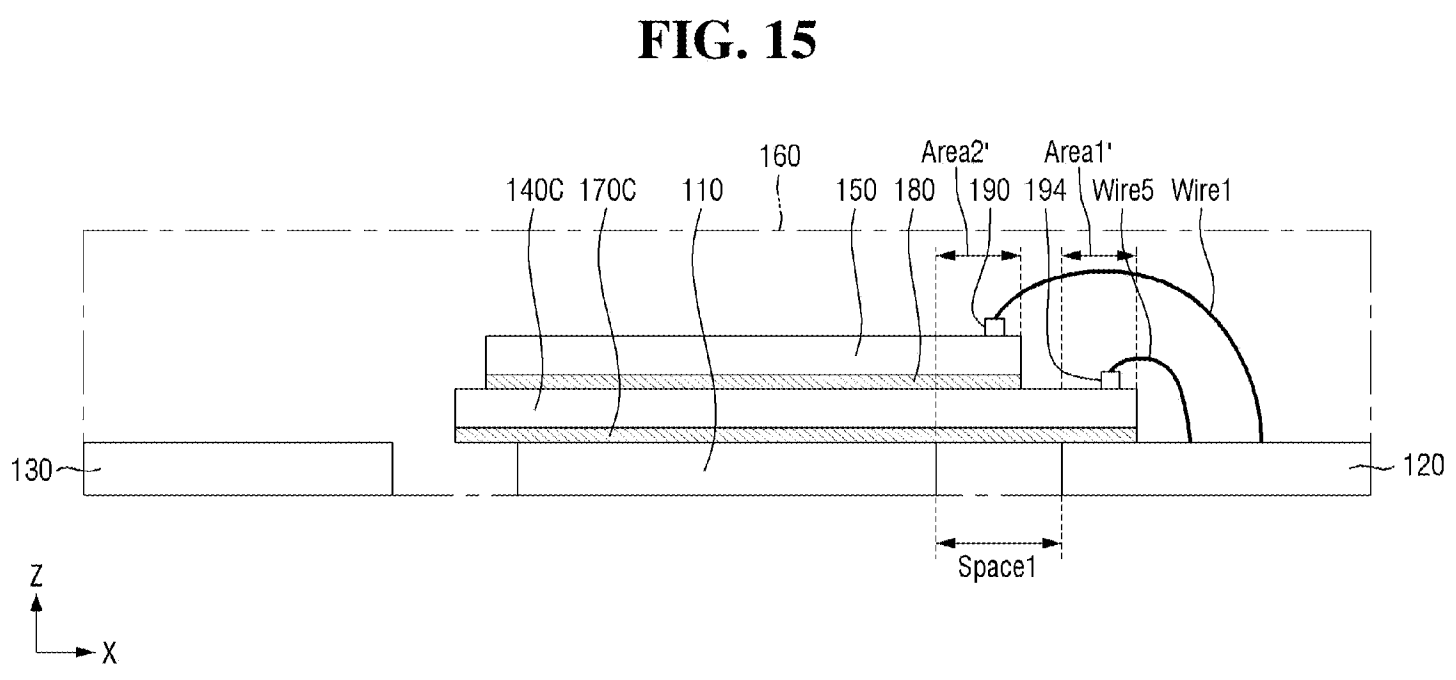

FIG. 14 is a plan view of the semiconductor package of FIG. 13 when viewed downward in the Z-axis direction. FIG. 15 is a cross-sectional view taken along line V-V of FIG. 14.

Referring to FIGS. 14 and 15, a point on the upper surface of the spacer 140C to which the fifth wires Wire5 are connected (e.g., a center point of the fifth input/output pad 194) may be disposed in an area Area1' where the spacer 140C overlaps the first leads 120. In addition, a point on the upper surface of the semiconductor die 150 to which the first wires Wire1 are connected (e.g., a center point of the input/output pad Pad1 190) may be disposed in an area Area2' of the semiconductor die 150 that overlaps a space Space1 between the die paddle 110 and the first leads 120. As such, when the spacer 140C is implemented as a semiconductor die, the point at which the fifth wires Wire5 are connected to the upper surface of the spacer 140C is located in the area where the spacer 140C overlaps the first leads 120. Thus, the structural stability of the semiconductor package may be achieved or improved.

Figure 16:
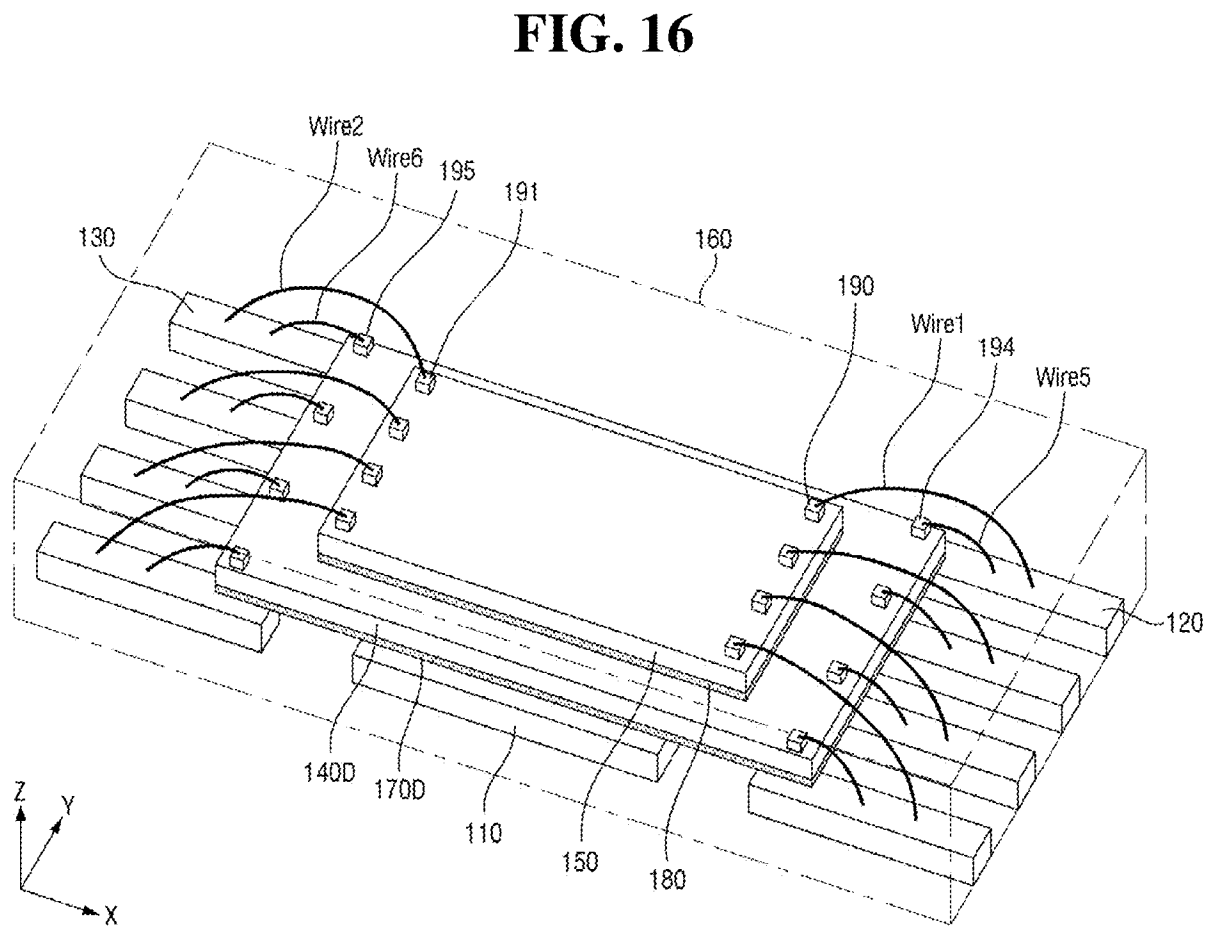
Figure 17:
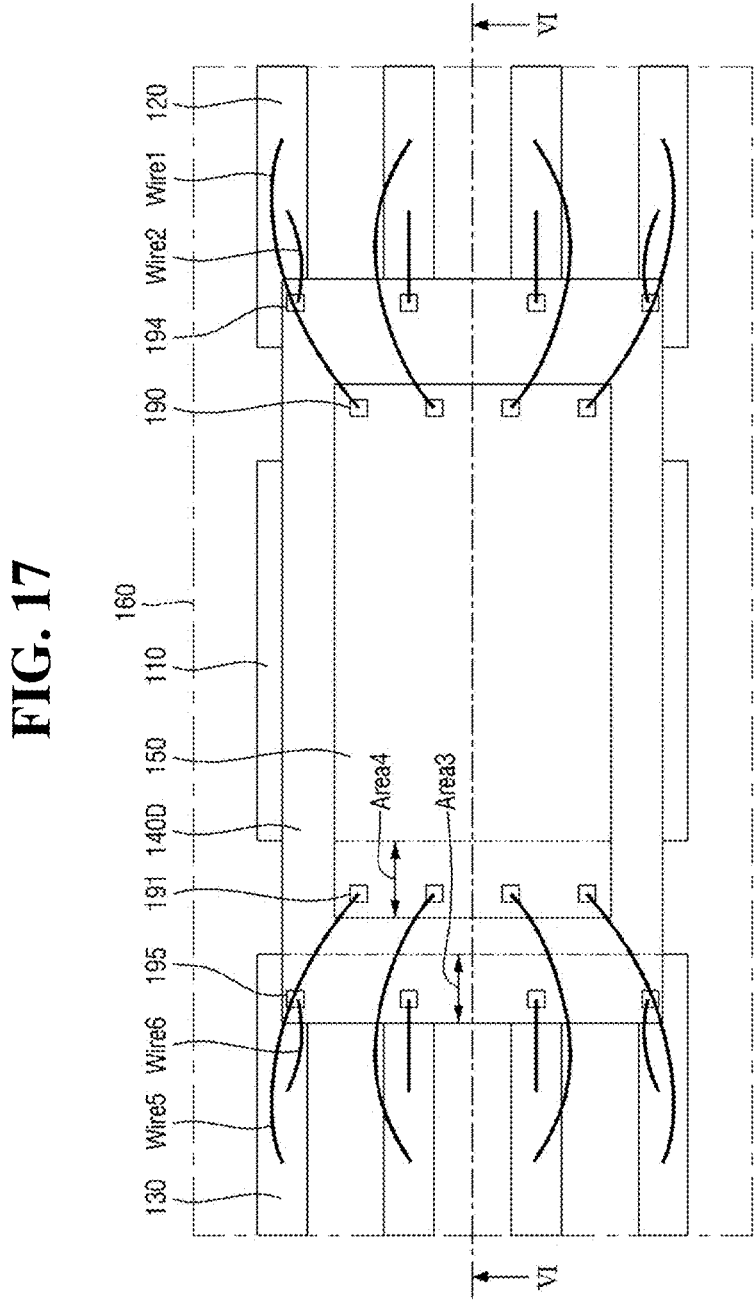
FIG. 17 is a plan view of the semiconductor package of FIG. 16 when viewed downward in the Z-axis direction.
Figure 18:
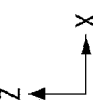
FIG. 18 is a cross-sectional view taken along line VI-VI of FIG. 17.

FIG. 16 is a perspective view illustrating a semiconductor package according to a sixth example embodiment of the present disclosure. FIG. 17 is a plan view of the semiconductor package of FIG. 16 when viewed downward in the Z-axis direction. FIG. 18 is a cross-sectional view taken along line VI-VI of FIG. 17. Hereinafter, redundant descriptions will be omitted and differences from the above example embodiments will be mainly described.

Referring to FIG. 16, a semiconductor package according to a sixth example embodiment of the present disclosure includes a die paddle 110, first leads 120, second leads 130, a spacer 140D, a semiconductor die 150, first, second, fifth, and sixth wires Wire1, Wire2, Wire5, and Wire6 and a mold film 160. In this case, the spacer 140D may be implemented as a semiconductor die serving an actual function, rather than dummy silicon. Thus, the spacer 140D may be referred to as another semiconductor die. That is, sixth input/output pads 195 may be formed on an upper surface of the spacer 140D and the sixth wires Wire6 may be connected to the sixth input/output pads 195. The spacer 140D may be connected to the second leads 130 through the sixth wires Wire6 to transmit and receive a signal to and from the PCB. As such, the spacer 140D serving to support the semiconductor die 150 may be implemented as a semiconductor die serving an actual function, rather than dummy silicon, and the number of input/output pads may be increased. Thus, the capacity of the semiconductor die mounted in the semiconductor package may be increased.

Then, referring to FIGS. 17 and 18, the spacer 140D may overlap the second leads 130. In this case, a point on the upper surface of the spacer 140D to which the sixth wires Wire6 are connected (e.g., a center point of the sixth input/output pad 195) may be disposed in an area Area3 where the spacer 140D overlaps the second leads 130. In addition, a point on the upper surface of the semiconductor die 150 to which the fifth wires Wire5 are connected (e.g., a center point of the input/output pad) may be disposed in an area Area4 of the semiconductor die that overlaps a space Space2 between the die paddle 110 and the second leads 130. As such, when the spacer 140D is implemented as a semiconductor die, the point at which the sixth wires Wire6 are connected to the upper surface of the spacer 140d is located in the area where the spacer 140D overlaps the second leads 130. Thus, the structural stability of the semiconductor package may be achieved.

Figure 19:
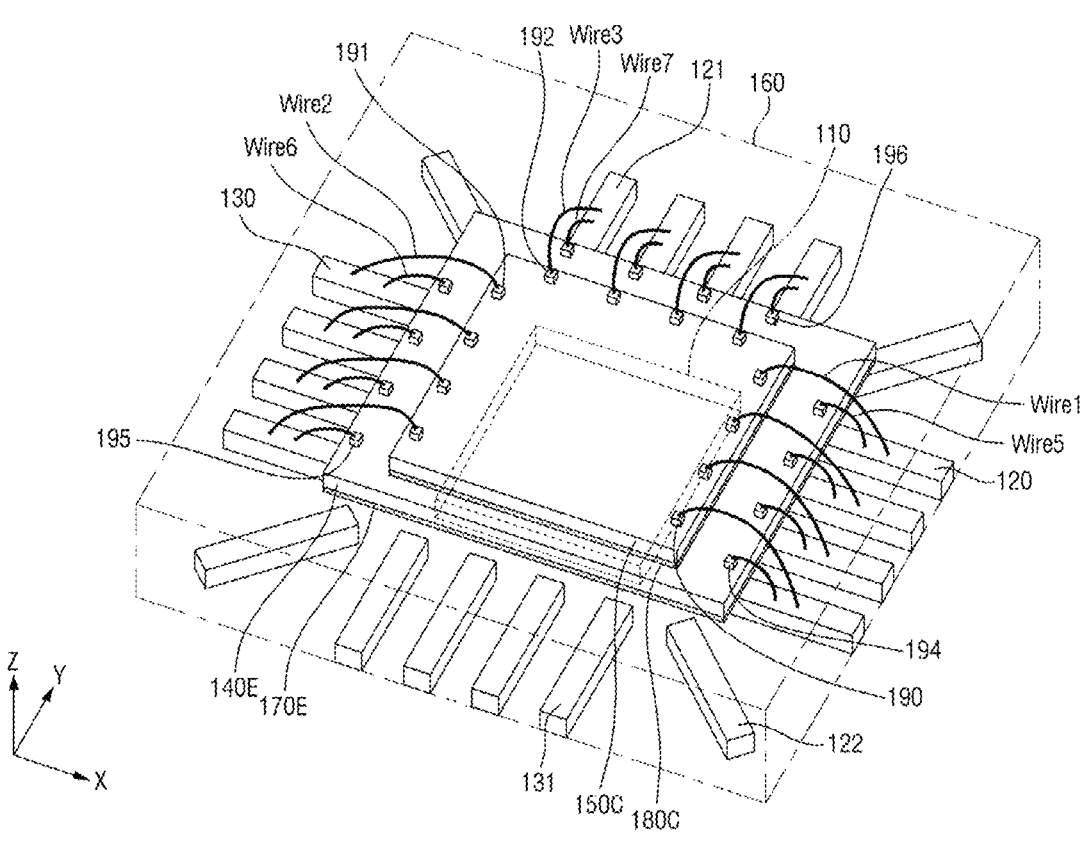
FIG. 19 is a perspective view illustrating a semiconductor package according to a seventh example embodiment of the present disclosure.
Figure 20:
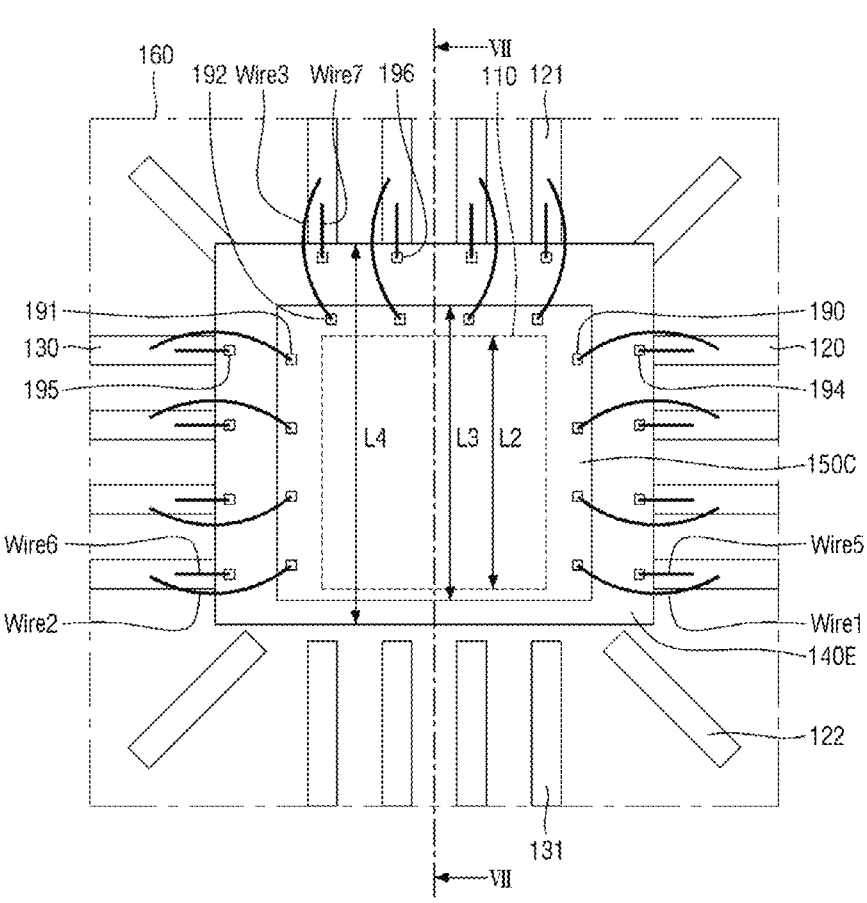
FIG. 20 is a plan view of the semiconductor package of FIG. 19 when viewed downward in the Z-axis direction.
Figure 20:
Figure 21:
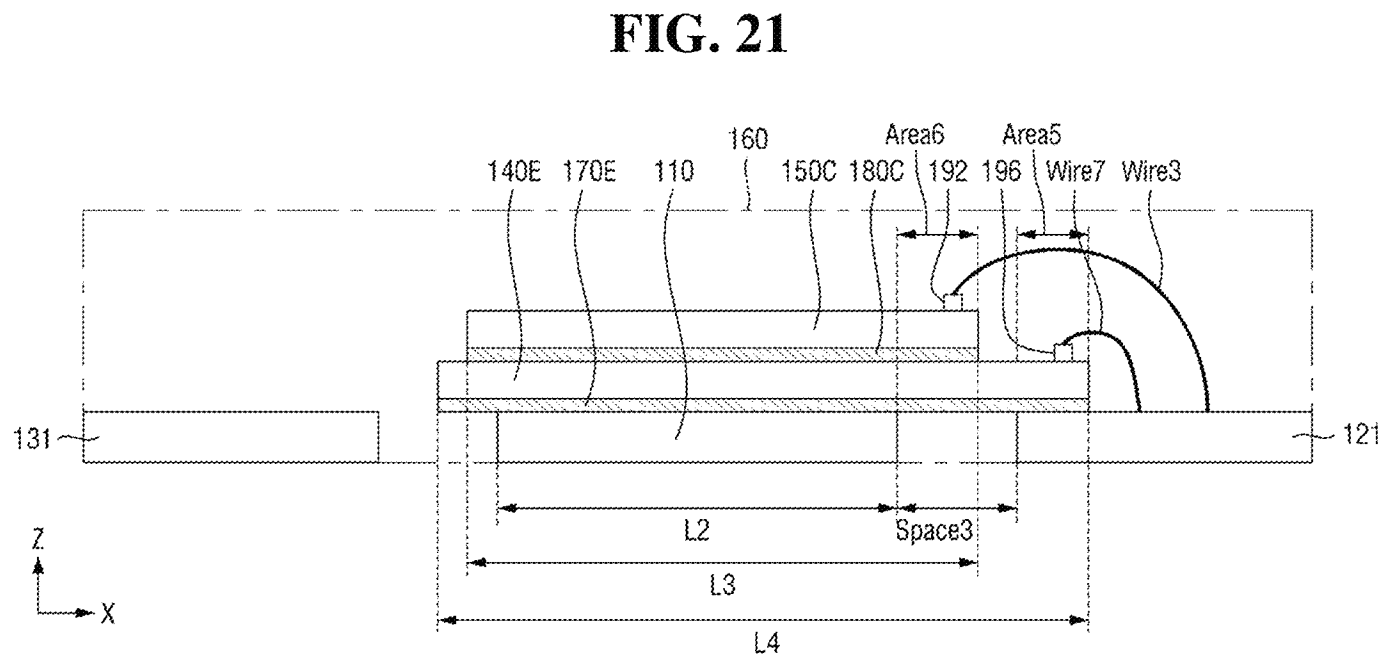

FIG. 19 is a perspective view illustrating a semiconductor package according to a seventh example embodiment of the present disclosure. FIG. 20 is a plan view of the semiconductor package of FIG. 19 when viewed downward in the Z-axis direction. FIG. 21 is a cross-sectional view taken along line VII-VII of FIG. 20. Hereinafter, redundant descriptions will be omitted and differences from the above example embodiments will be mainly described.

Referring to FIG. 19, a semiconductor package according to a seventh example embodiment of the present disclosure includes a die paddle 110, first leads 120, second leads 130, third leads 121, fourth leads 131, a spacer 140E, a semiconductor die 150C, first to third wires Wire1 to Wire3, fifth to seventh Wire5 to Wire7, and a mold film 160.

In this case, the spacer 140E may be implemented as a semiconductor die serving an actual function, rather than dummy silicon. Thus, the spacer 140E may be referred to as another semiconductor die. That is, seventh input/output pads 196 may be formed on an upper surface of the spacer 140E and the seventh wires Wire7 may be connected to the seventh input/output pads 196. The spacer 140E may be connected to the third leads 121 through the seventh wires Wire7 to transmit and receive a signal to and from the PCB. As such, the spacer 140E serving to support the semiconductor die 150C may be implemented as a semiconductor die serving an actual function, rather than dummy silicon. Thus, the number of input/output pads may be increased, and thus the capacity of the semiconductor die mounted in the semiconductor package may be increased.

Referring to FIGS. 20 and 21, unlike the fifth and sixth example embodiments, in the semiconductor package according to the seventh example embodiment of the present disclosure, a length L4 of the spacer 140E in the second direction may be longer than a length L2 of the die paddle 110 in the second direction. Accordingly, as shown in FIGS. 20 and 21, the spacer 140E may overlap the third leads 121. As such, overhang regions of the semiconductor die 150C that are not supported by the die paddle 110 may be supported by the spacer 140E. Edge regions of the spacer that is not supported by the die paddle 110 may be supported by the third leads 121. Therefore, the seventh input/output pads 196 are additionally disposed on the upper surface of the spacer 140E so that the spacer 140E may be electrically connected to the third leads 121 through the seventh wires Wire7.

As shown in FIG. 21, when the seventh wire Wire7 is connected to the seventh input/output pad 196 formed on the upper surface of the spacer 140E, a point on the upper surface of the spacer 140E to which the seventh wire Wire7 is connected (e.g., a center point of the seventh input/output pad 196) may be disposed in an area Area5 where the spacer 140E overlaps the third leads 121. In addition, a point on the upper surface of the semiconductor die 150C to which third wire Wire3 is connected (e.g., a center point of the third input/output pad 192) may be disposed in an area Area6 of the semiconductor die 150C that overlaps a space Space3 between the die paddle 110 and the third leads 121. As such, when the spacer 140E is implemented as a semiconductor die, the point at which the wire Wire7 is connected to the upper surface of the spacer 140E is located in the area where the spacer 140E overlaps the third lead 121. Thus, the structural stability of the semiconductor package may be achieved.

Figure 22:
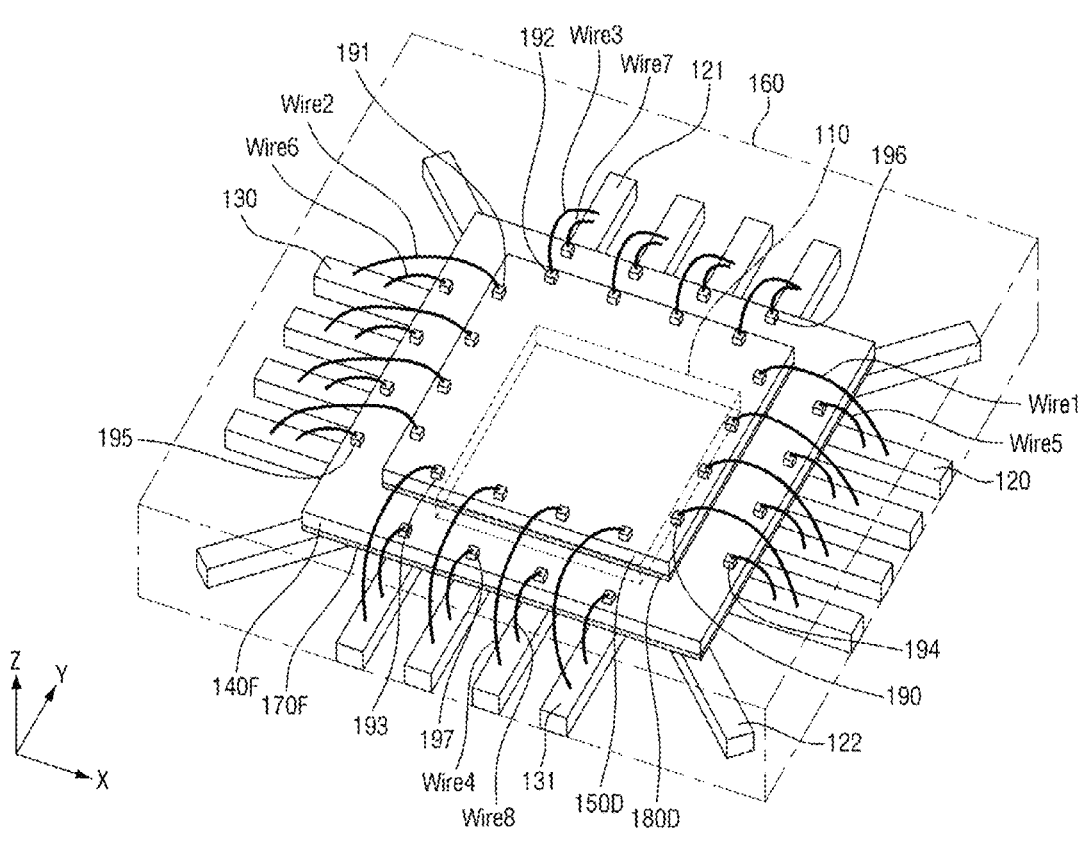
FIG. 22 is a perspective view illustrating a semiconductor package according to an eighth example embodiment of the present disclosure.
Figure 23:
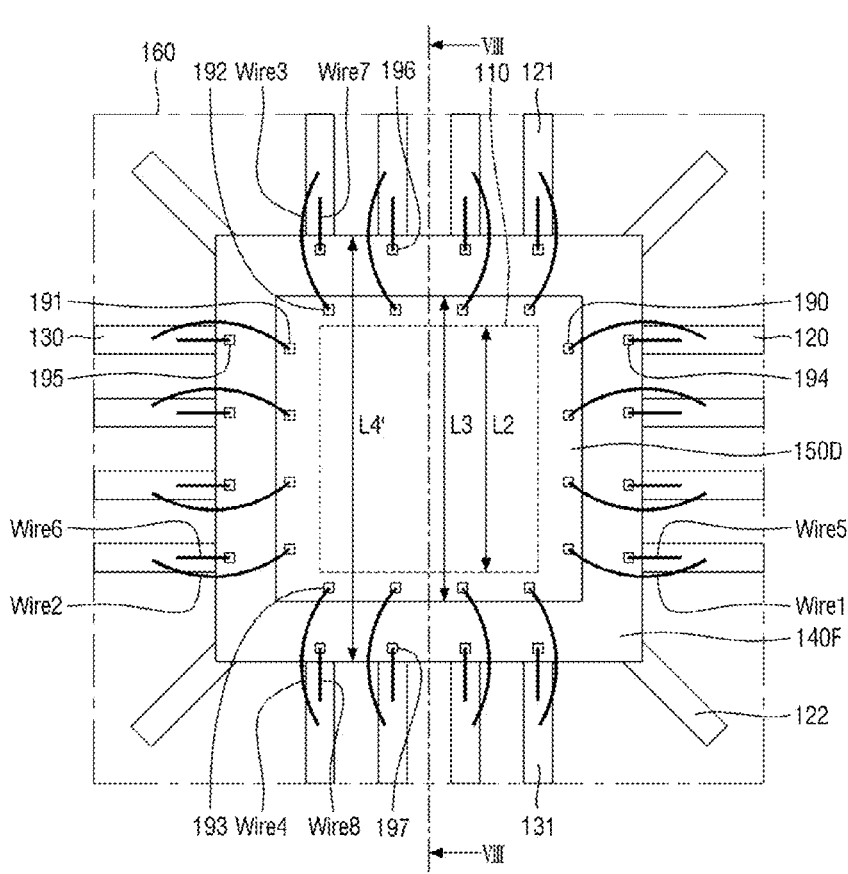
FIG. 23 is a plan view of the semiconductor package of FIG. 22 when viewed downward in the Z-axis direction.
Figure 23:
Figure 24:
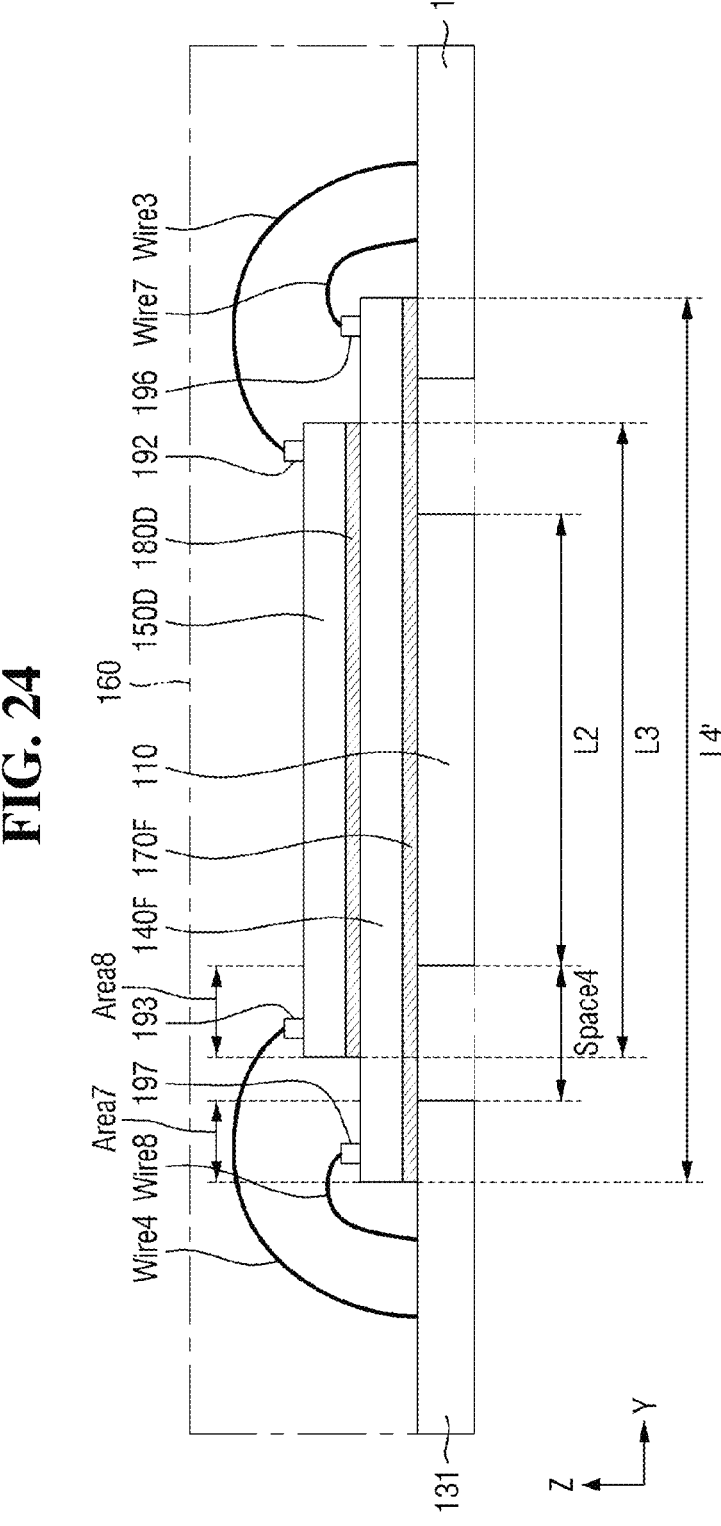
FIG. 24 is a cross-sectional view taken along line VIII-VIII of FIG. 23.

FIG. 22 is a perspective view illustrating a semiconductor package according to an eighth example embodiment of the present disclosure. FIG. 23 is a plan view of the semiconductor package of FIG. 22 when viewed downward in the Z-axis direction. FIG. 24 is a cross-sectional view taken along line VIII-VIII of FIG. 23. Hereinafter, redundant descriptions will be omitted and differences from the above example embodiments will be mainly described.

Referring to FIG. 22, a semiconductor package according to an eighth example embodiment of the present disclosure includes a die paddle 110, first leads 120, second leads 130, third leads 121, fourth leads 131, a spacer 140F, a semiconductor die 150D, first to eighth wires Wire1 to Wire8, and a mold film 160.

In this case, the spacer 140F may be implemented as a semiconductor die serving an actual function, rather than dummy silicon. That is, eighth input/output pads 197 may be formed on an upper surface of the spacer 140F and the eighth wires Wire8 may be connected to the eighth input/output pads 197. The spacer 140F may be connected to the fourth leads 131 through the eighth wires Wire8 to transmit and receive a signal to and from the PCB. As such, the spacer 140F serving to support the semiconductor die 150D may be implemented as a semiconductor die serving an actual function, rather than dummy silicon. The spacer 140F may be referred to as another semiconductor die. Accordingly, the number of input/output pads may be increased, and thus the capacity of the semiconductor die mounted in the semiconductor package may be increased.

Referring to FIGS. 23 and 24, a length L4' of the spacer 140F in the second direction may be longer than a length L2 of the die paddle 110 in the second direction. Accordingly, as shown in FIGS. 23 and 24, the spacer 140F may overlap the fourth leads 131. As such, overhang regions of the semiconductor die 150D that are not supported by the die paddle 110 may be supported by the spacer 140F. Edge regions of the spacer 140F that is not supported by the die paddle 110 may be supported by the fourth leads 131. Therefore, the eighth input/output pads 197 may be additionally disposed on the upper surface of the spacer 140F and the spacer 140F may be electrically connected to the fourth leads 131 through the eighth wires Wire8.

As shown in FIG. 24, when the eighth wire Wire8 is connected to the eighth input/output pad 197 formed on the upper surface of the spacer 140F, a point on the upper surface of the spacer 140F to which the eighth wires Wire8 are connected (e.g., a center point of the eighth input/output pad 197 may be disposed in an area Area7 where the spacer 140F overlaps the fourth leads 131. In addition, a point on the upper surface of the semiconductor die 150D to which the fourth wires Wire4 are connected (e.g., a center point of the fourth input/output pad 193 may be disposed in an area Area8 of the semiconductor die 150D that overlaps a space Space4 between the die paddle 110 and the fourth leads 131. As such, when the spacer 140F is implemented as a semiconductor die, the point at which the eighth wire Wire8 is connected to the upper surface of the spacer 140F is located in the area where the spacer 140F overlaps the fourth leads 131. Thus, the structural stability of the semiconductor package may be achieved.

While the present disclosure has been particularly illustrated and described with reference to some example embodiments thereof, it will be understood by those of ordinary skill in the art that various changes in form and detail may be made therein without departing from the spirit and scope of the present disclosure as defined by the following claims. The disclosed example embodiments should be considered in a descriptive sense only and not for purposes of limitation.

What is claimed:

1. A semiconductor package comprising:
a die paddle;
a first lead spaced apart from the die paddle and on one side of the die paddle;
a second lead spaced apart from the die paddle and on another side of the die paddle;
a spacer on the die paddle;
a semiconductor die on the spacer;
a first wire configured to connect an upper surface of the semiconductor die to the first lead; and
a mold film configured to cover the die paddle, the first lead, the second lead, the spacer, the semiconductor die, and the first wire,
wherein a first width of the spacer is greater than a second width of the die paddle so that the spacer overlaps the first lead, and
wherein when a first length between the die paddle and the first lead is A and a second length of a portion of the spacer overlapping the first lead is B, $1/5 \leq B/A \leq 1/2$ is satisfied.

2. The semiconductor package of claim 1, further comprising:
   a second wire configured to connect the upper surface of the semiconductor die to the second lead,
   wherein the spacer overlaps the second lead.

3. The semiconductor package of claim 1, further comprising:
   an adhesive layer on a lower surface of the spacer and the spacer is attached to the die paddle and the first lead by the adhesive layer.

4. The semiconductor package of claim 1,
   wherein a length of an overlapping portion between the spacer and the first lead is between 10 μm to 3 mm.

5. The semiconductor package of claim 1,
   wherein the first wire is in contact with the upper surface of the semiconductor die at a region where the semiconductor die overlaps the spacer.

6. The semiconductor package of claim 5,
   wherein a third width of the semiconductor die is greater than the first width of the spacer.

7. The semiconductor package of claim 1,
   wherein the first width and the second width are measured in a first direction and a first length of the spacer in a second direction is shorter than a second length of the die paddle in the second direction.

8. The semiconductor package of claim 1, wherein:
   the die paddle comprises a first side surface and a second side surface that face each other, and a third side surface and a fourth side surface that face each other,
   the first lead is spaced apart from the first side surface,
   the second lead is spaced apart from the second side surface, and
   the semiconductor package further comprises a third lead and a fourth lead that are spaced apart from the third side surface and the fourth side surface, respectively, and face each other.

9. The semiconductor package of claim 8,
   wherein the first width and the second width are measured in a first direction and a first length of the spacer in a second direction is longer than a second length of the die paddle in the second direction.

10. A semiconductor package comprising:
    a die paddle;
    a first lead spaced apart from the die paddle and on one side of the die paddle;
    a second lead spaced apart from the die paddle and on another side of the die paddle;
    a spacer on the die paddle;
    a semiconductor die on the spacer;
    a first wire configured to connect an upper surface of the spacer to the first lead;
    a second wire configured to connect an upper surface of the semiconductor die to the first lead; and
    a mold film configured to cover the die paddle, the first lead, the spacer, the semiconductor die, the first wire, and the second wire, wherein
    the die paddle is apart from the first lead by a first space,
    the first wire is in contact with a first region of the spacer that overlaps the first lead, and
    the second wire is in contact with a second region of the semiconductor die that overlaps the first space.

11. A semiconductor package comprising:
    a die paddle having a first side surface and a second side surface;
    a first lead spaced apart from the first side surface;
    a second lead spaced apart from the second side surface that faces the first side surface;
    a first semiconductor die attached to an upper surface of the die paddle;
    a second semiconductor die attached to an upper surface of the first semiconductor die; and
    a mold film configured to cover the die paddle, the first lead, the second lead, the first semiconductor die, and the second semiconductor die,
    wherein a first width of the first semiconductor die is greater than a second width of the die paddle so that the first semiconductor die overlaps the first lead,
    the first semiconductor die is connected to the first lead through a first wire, and
    the second semiconductor die is connected to the first lead through a second wire.

12. The semiconductor package of claim 11, wherein:
    the first semiconductor die overlaps the second lead,
    the first semiconductor die is connected to the second lead through a third wire, and
    the second semiconductor die is connected to the second lead through a fourth wire.

13. The semiconductor package of claim 12,
    wherein the first wire is connected to the upper surface of the first semiconductor die in a first area where the first semiconductor die overlaps the first lead.

14. The semiconductor package of claim 13,
    wherein the third wire is connected to the upper surface of the first semiconductor die in a second area where the first semiconductor die overlaps the second lead.

15. The semiconductor package of claim 12,
    wherein a third width of the second semiconductor die is greater than the second width of the die paddle.

16. The semiconductor package of claim 12,
    wherein the die paddle has a third side surface and a fourth side surface that face each other and the semiconductor package further comprises a third lead spaced apart from the third side surface and a fourth lead spaced apart from the fourth side surface.

17. The semiconductor package of claim 16,
    wherein the mold film is configured to cover the third lead and the fourth lead.

18. The semiconductor package of claim 16, wherein:
    the first width and the second width are measured in a first direction,
    a first length of the first semiconductor die in a second direction is longer than a second length of the die paddle in the second direction so that the first semiconductor die overlaps the third lead,
    the first semiconductor die is connected to the third lead through a fifth wire, and
    the second semiconductor die is connected to the third lead through a sixth wire.

19. The semiconductor package of claim 18, wherein:
    the first semiconductor die overlaps the fourth lead,
    the first semiconductor die is connected to the fourth lead through a seventh wire, and
    the second semiconductor die is connected to the fourth lead through an eighth wire.

* * * * *